United States Patent
Yogo et al.

(10) Patent No.: US 11,965,760 B2
(45) Date of Patent: Apr. 23, 2024

(54) FLOW RATE DETECTING DEVICE OF INTAKE AIR IN AN INTERNAL COMBUSTION ENGINE

(71) Applicant: Hitachi Automotive Systems, Ltd., Hitachinaka (JP)

(72) Inventors: Takayuki Yogo, Hitachinaka (JP); Binti Haridan Fatin Farhanah, Hitachinaka (JP); Akira Uenodan, Hitachinaka (JP); Noboru Tokuyasu, Hitachinaka (JP); Takahiro Miki, Hitachinaka (JP); Hiroaki Hoshika, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 805 days.

(21) Appl. No.: 17/046,859

(22) PCT Filed: Feb. 13, 2019

(86) PCT No.: PCT/JP2019/005053
§ 371 (c)(1),
(2) Date: Oct. 12, 2020

(87) PCT Pub. No.: WO2019/225073
PCT Pub. Date: Nov. 28, 2019

(65) Prior Publication Data
US 2021/0041275 A1  Feb. 11, 2021

(30) Foreign Application Priority Data
May 22, 2018 (JP) ................................. 2018-097555

(51) Int. Cl.
*G01F 1/684* (2006.01)
*H05K 1/03* (2006.01)
(Continued)

(52) U.S. Cl.
CPC ........... *G01F 1/684* (2013.01); *H05K 1/0306* (2013.01); *H05K 1/111* (2013.01); *H05K 1/181* (2013.01)

(58) Field of Classification Search
CPC ...... G01F 1/684; H05K 1/0306; H05K 1/111; H05K 1/181
See application file for complete search history.

(56) References Cited

U.S. PATENT DOCUMENTS

2001/0011777 A1* 8/2001 Kano ................ H01L 23/49816
257/781
2002/0148289 A1  10/2002 Isogai
(Continued)

FOREIGN PATENT DOCUMENTS

CN         1899003 A  *  1/2007  ............. C09K 13/00
JP     2002-357467 A     12/2002
(Continued)

OTHER PUBLICATIONS

International Search Report with English translation and Written Opinion issued in corresponding application No. PCT/JP2019/005053 dated Apr. 9, 2019.

*Primary Examiner* — Natalie Huls
*Assistant Examiner* — Sharad Timilsina
(74) *Attorney, Agent, or Firm* — Foley & Lardner LLP

(57) ABSTRACT

An object of the present invention is to provide a compact air flow rate measuring device with improved stain resistance. A physical quantity detecting device of the present invention includes: a semiconductor element having a flow rate detection unit 205; a circuit board 207 supporting the semiconductor element; and a conductive cover 202 fixing the circuit board 207, and the semiconductor element is fixed to the circuit board 207 such that the flow rate detection unit 205 faces the cover 202.

8 Claims, 32 Drawing Sheets

(51) Int. Cl.
   *H05K 1/11*    (2006.01)
   *H05K 1/18*    (2006.01)

(56) References Cited

U.S. PATENT DOCUMENTS

| | | | |
|---|---|---|---|
| 2006/0112763 A1* | 6/2006 | Uramachi | G01F 1/6845 |
| | | | 73/204.22 |
| 2010/0242589 A1 | 9/2010 | Morino | |
| 2013/0192388 A1* | 8/2013 | Kono | G01F 1/34 |
| | | | 73/861.47 |
| 2015/0250072 A1* | 9/2015 | Ichikawa | H01R 13/6658 |
| | | | 439/587 |
| 2017/0115144 A1* | 4/2017 | Watanabe | H01L 23/3121 |
| 2018/0087944 A1 | 3/2018 | Haag | |
| 2019/0120675 A1 | 4/2019 | Watanabe | |

FOREIGN PATENT DOCUMENTS

| | | |
|---|---|---|
| JP | 2004-226315 A | 8/2004 |
| JP | 2006-153694 A | 6/2006 |
| JP | 2011-075361 A | 4/2011 |
| JP | 2017-190948 A | 10/2017 |

\* cited by examiner

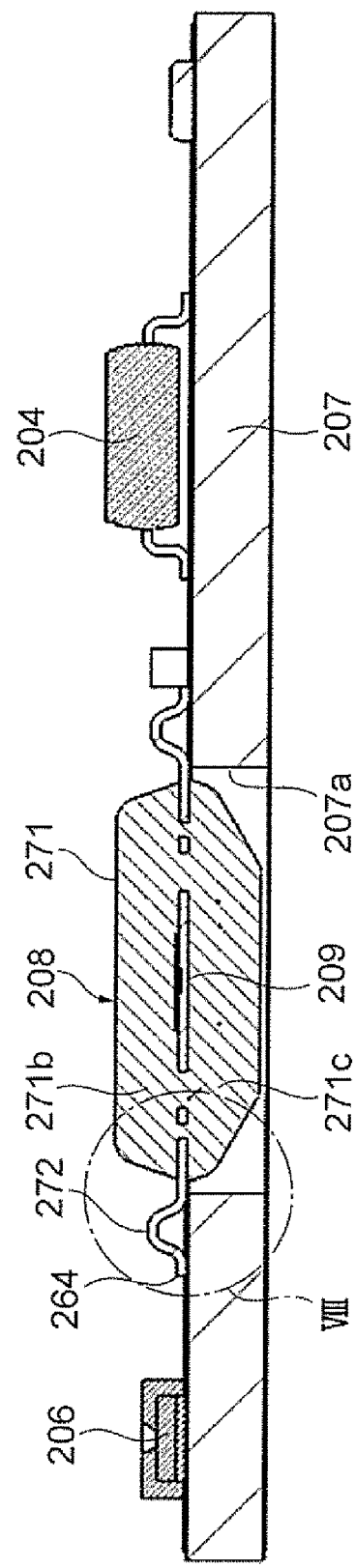

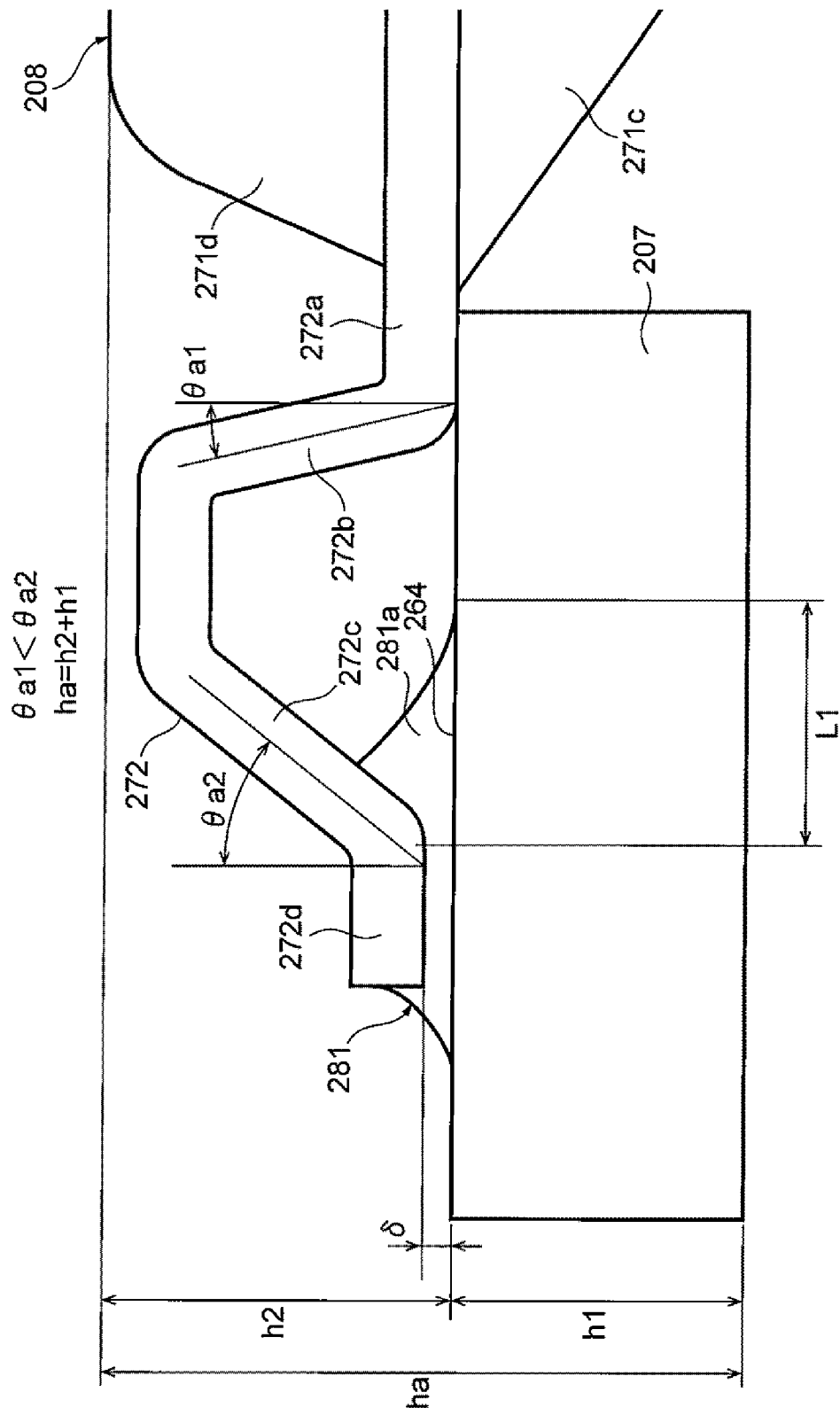

FLOW RATE DETECTING DEVICE OF INTAKE AIR IN AN INTERNAL COMBUSTION ENGINE

TECHNICAL FIELD

The present invention relates to a physical quantity detecting device that detects a physical quantity of intake air of an internal combustion engine, for example.

BACKGROUND ART

For example, PTL 1 discloses a structure in which a conductor is formed on an inner wall surface of a through-hole formed by penetrating front and back surfaces of a substrate and is electrically connected to a substrate conductor portion.

CITATION LIST

Patent Literature

PTL 1: JP 2002-357467 A

SUMMARY OF INVENTION

Technical Problem

The above-described conventional device has the conductor formed in the through-hole formed in the substrate to improve the corrosion resistance, and does not contribute to the improvement of the stain resistance of a sensor element itself. A sensor that measures a flow rate of intake air drawn into an internal combustion engine needs to be improved in stain resistance and downsized in order to reduce a pressure loss.

The present invention has been made in view of the above points, and an object thereof is to provide a compact air flow rate measuring device with improved stain resistance.

Solution to Problem

A physical quantity detecting device of the present invention that solves the above problems includes: a semiconductor element having a flow rate detection unit; a circuit board supporting the semiconductor element; and a conductive base member fixing the circuit board. The semiconductor element is fixed to the circuit board such that the flow rate detection unit faces the base member.

Advantageous Effects of Invention

According to the present invention, it is possible to obtain the compact physical quantity detecting device having high stain resistance.

Another characteristic relating to the present invention will become apparent from the description of the present specification and the accompanying drawings. In addition, other objects, configurations, and effects will be apparent from the following description of embodiments.

BRIEF DESCRIPTION OF DRAWINGS

FIG. 6B is a cross-sectional view taken along the line VIB-VIB of FIG. 6A.

FIG. 8 is a view illustrating a bent shape of a connection terminal according to the present embodiment.

DESCRIPTION OF EMBODIMENTS

A mode for carrying out the invention (hereinafter, an embodiment) to be described later solves various problems desired to be solved as an actual product, and particularly solves various types of problems desired for the use as a detection device which detects a physical quantity of intake air of a vehicle, and achieves various effects. One of the various problems to be solved by the following embodiment corresponds to the content that has been described in the above-described section of Technical Problem. In addition, one of the various effects to be achieved by the following embodiment corresponds to the effect described in the above-described section of Advantageous Effects of Invention. The various problems to be solved by the following embodiment and the various effects to be achieved by the following embodiment will be described in the description of the following embodiment. Accordingly, problems and the advantages to be solved and achieved by the following embodiment other than the content in the section of Technical Problem and the content in the section of Advantageous Effects of Invention will also be described.

In the following embodiment, the same reference signs represent the same configurations even among different drawing numbers, and achieve the same effects. There is also a case where only a reference sign is given to a figure with respect to a configuration that has already been described in a drawing and a description thereof is omitted.

Figure 1:
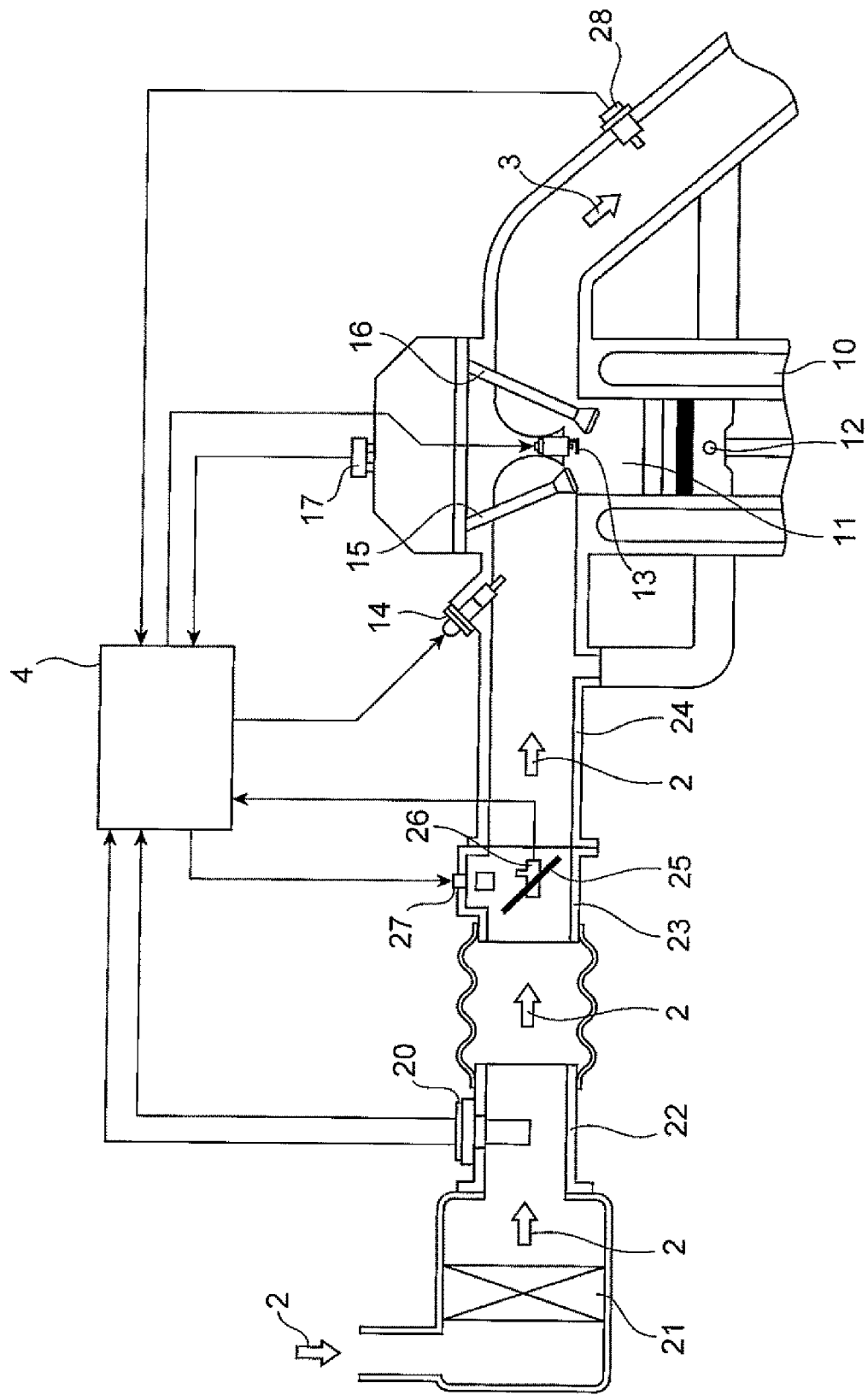
FIG. 1 is a system diagram illustrating an embodiment in which a physical quantity detecting device according to the present invention is used in an internal combustion engine control system.

FIG. 1 is a system diagram illustrating the embodiment in which the physical quantity detecting device according to the present invention is used in an electronic fuel injection-type internal combustion engine control system 1. Intake air is sucked from an air cleaner 21 as a gas 2 to be measured based on an operation of an internal combustion engine 10, which includes an engine cylinder 11 and an engine piston 12, and is guided to a combustion chamber of the engine cylinder 11 via, for example, an intake body as a main passage 22, a throttle body 23, and an intake manifold 24. A physical quantity of the gas 2 to be measured, which is the intake air guided to the combustion chamber, is detected by a physical quantity detecting device 20 according to the present invention. Fuel is supplied by a fuel injection valve 14 on the basis of the detected physical quantity, and is guided to the combustion chamber in the state as an air-fuel mixture with the gas 2 to be measured. Incidentally, the fuel injection valve 14 is provided at an intake port of the internal combustion engine in the present embodiment, and the fuel injected to the intake port molds the air-fuel mixture together with the gas 2 to be measured. The air-fuel mixture is guided to the combustion chamber via an intake valve 15 and is burnt to generate mechanical energy.

The fuel and air guided to the combustion chamber form a mixed state of the fuel and the air, and is explosively burnt by spark ignition of a spark plug 13, thereby generating the mechanical energy. After burning, the gas is guided into an exhaust pipe from an exhaust valve 16, and is discharged, as an exhaust gas 3, outside a car from the exhaust pipe. A flow rate of the gas 2 to be measured as the intake air guided to the combustion chamber is controlled by a throttle valve 25 whose opening degree is changed based on an operation of an accelerator pedal. A supply amount of fuel is controlled on the basis of the flow rate of the intake air guided to the combustion chamber, and a driver can control the mechanical energy generated by the internal combustion engine by controlling the opening degree of the throttle valve 25 and controlling the flow rate of the intake air guided to the combustion chamber.

<Overview of Control of Internal Combustion Engine Control System>

The physical quantity, such as the flow rate, temperature, humidity, and pressure, of the gas 2 to be measured, which is the intake air taken from the air cleaner 21 and flowing in the main passage 22, is detected by the physical quantity detecting device 20, and an electric signal indicating the physical quantity of the intake air is input to a control device 4 from the physical quantity detecting device 20. In addition, an output of a throttle angle sensor 26, which measures the opening degree of the throttle valve 25, is input to the control device 4. Further, an output of a rotation angle sensor 17 is input to the control device 4 in order to measure a position or a state of the engine piston 12, the intake valve 15, or the exhaust valve 16 of the internal combustion engine, and rotation speed of the internal combustion engine. An output of an oxygen sensor 28 is input to the control device 4 in order to measure a state of a mixing ratio between the amount of fuel and the amount of air based on the state of the exhaust gas 3.

The control device 4 computes a fuel injection amount and an ignition timing on the basis of the physical quantity of the intake air as the output of the physical quantity detecting device 20 and the rotation speed of the internal combustion engine measured on the basis of the output of the rotation angle sensor 17. The fuel amount to be supplied from the fuel injection valve 14 and the ignition timing ignited by the spark plug 13 are controlled on the basis of these computation results. Practically, the supply amount of fuel and the ignition timing are further finely controlled on the basis of a change state of the temperature or a throttle angle detected by the physical quantity detecting device 20, a change state of the engine rotation speed, and a state of an air-fuel ratio measured by the oxygen sensor 28. The control device 4 further controls the amount of air bypassing the throttle valve 25 using an idle air control valve 27 in an idle operation state of the internal combustion engine and controls the rotation speed of the internal combustion engine in the idle operation state.

Both the supply amount of fuel and the ignition timing, which are major control variables of the internal combustion engine, are computed using the output of the physical quantity detecting device 20 as the main parameter. Accordingly, improvement of detection accuracy of the physical quantity detecting device 20, suppression of a change over time, and improvement of reliability are important in regard to improvement of control accuracy of a vehicle and securing of the reliability.

In particular, recently, a request for fuel saving of vehicles has extremely increased, and further, a request for purification of an exhaust gas has extremely increased. In order to respond to such requests, it is very important to improve the detection accuracy of the physical quantity of the gas 2 to be measured which is the intake air detected by the physical quantity detecting device 20. In addition, it is also important for the physical quantity detecting device 20 to maintain high reliability.

A vehicle to which the physical quantity detecting device 20 is equipped is used under environment where a change in temperature or humidity is great. It is desirable that the physical quantity detecting device 20 be configured on consideration of response to such a change in temperature or humidity in the use environment and response to dust, pollutants, and the like.

In addition, the physical quantity detecting device 20 is mounted to the intake pipe which is affected by heat generated from the internal combustion engine. Thus, the heat generated from the internal combustion engine is transferred to the physical quantity detecting device 20 via the intake pipe serving as the main passage 22. The physical quantity detecting device 20 detects the flow rate of the gas 2 to be measured by performing the heat transfer with the gas 2 to be measured, and thus, it is important to suppress influence of heat from the outside as much as possible.

The physical quantity detecting device 20 equipped in the car, as will be described later, not only solves the problem described in the section of Technical Problem and achieves the effects described in the section of Advantageous Effects of Invention but also solves various problems and achieves various effects which are required as the product on sufficient consideration of the above-described various problems as will be described later. Specific problems to be solved and specific effects to be achieved by the physical quantity detecting device 20 will be described in the following description of the embodiment.

<Appearance Structure of Physical Quantity Detecting Device>

FIGS. 2A to 2F are views illustrating an appearance of the physical quantity detecting device. Incidentally, it is assumed that the gas to be measured flows along the central axis of the main passage in the following description.

The physical quantity detecting device 20 is used by being inserted inside the main passage 22 through an attachment hole provided in a passage wall of the main passage 22. The physical quantity detecting device 20 includes a housing 201 and a cover 202 attached to the housing 201. The housing 201 is formed by injection molding of a synthetic resin material. The cover 202 is formed using, for example, a plate-shaped member made of a conductive material, such as an aluminum alloy, and is formed using a press-molded product of an aluminum alloy in the present embodiment. The cover 202 is formed in a thin plate shape and have a wide flat cooling surface.

The housing 201 includes: a flange 211 configured to fix the physical quantity detecting device 20 to the intake body as the main passage 22; a connector 212 protruding from the flange 211 and exposed to the outside from the intake body to perform electrical connection with an external device; and a measurement unit 213 which extends to protrude from the flange 211 toward the center of the main passage 22.

The measurement unit 213 has a thin and long shape extending from the flange 211 toward the center of the main passage 22, and has wide front surface 221 and back surface 222, and a pair of narrow side surfaces 223 and 224. The measurement unit 213 protrudes from an inner wall of the main passage 22 toward a passage center of the main passage 22 in a state where the physical quantity detecting device 20 is attached to the main passage 22. Then, the front surface 221 and the back surface 222 are arranged in parallel along the central axis of the main passage 22. Between the narrow side surfaces 223 and 224 of the measurement unit 213, the side surface 223 on one side of the measurement unit 213 in the lateral direction is arranged to face the upstream side of the main passage 22, and the side surface 224 on the other side of the measurement unit 213 in the lateral direction is arranged to face the downstream side of the main passage 22. In the state where the physical quantity detecting device 20 is attached to the main passage 22, a distal end portion of the measurement unit 213 serves as a lower surface 226.

Since a sub-passage inlet 231 is provided at the distal end portion of the measurement unit 213 extending from the flange 211 toward the center of the main passage 22 in the physical quantity detecting device 20, a gas in a portion near the central portion away from an inner wall surface, instead of the vicinity of the inner wall surface of the main passage 22, can be taken into a sub-passage. Thus, the physical quantity detecting device 20 can measure the flow rate of the gas in the portion away from the inner wall surface of the main passage 22, and can suppress a decrease in measurement accuracy caused by the influence of heat or the like.

The vicinity of the inner wall surface of the main passage 22 is in the state of being easily affected by the temperature of the main passage 22 so that the temperature of the gas 2 to be measured is different from the original temperature of the gas, which is different from an average state of the main gas in the main passage 22. In particular, when the main passage 22 is the intake body of the engine, it is often maintained at a high temperature due to the influence of heat from the engine. Thus, the gas in the vicinity of the inner wall surface of the main passage 22 is often higher than the original temperature of the main passage 22, which causes a decrease in measurement accuracy. In addition, in the vicinity of the inner wall surface of the main passage 22, the fluid resistance is large, and a flow velocity becomes lower than an average flow velocity of the main passage 22. Thus, if the gas in the vicinity of the inner wall surface of the main passage is taken into the sub-passage as the gas 2 to be measured, there is a possibility that the decrease in the flow velocity with respect to the average flow velocity of the main passage 22 leads to a measurement error.

Since the physical quantity detecting device 20 is provided with the sub-passage inlet 231 at the distal end portion of the thin and long measurement unit 213 extending from the flange 211 toward the center of the main passage 22, it is possible to reduce the measurement error relating to the decrease in the flow velocity in the vicinity of the inner wall surface. In addition, not only the sub-passage inlet 231 is provided at the distal end portion of the measurement unit 213 extending from the flange 211 toward the center of the main passage 22 but also a first outlet 232 and a second outlet 233 of the sub-passage are provided at the distal end portion of the measurement unit 213 in the physical quantity detecting device 20, and thus, the measurement error can be further reduced.

Figure 2A:
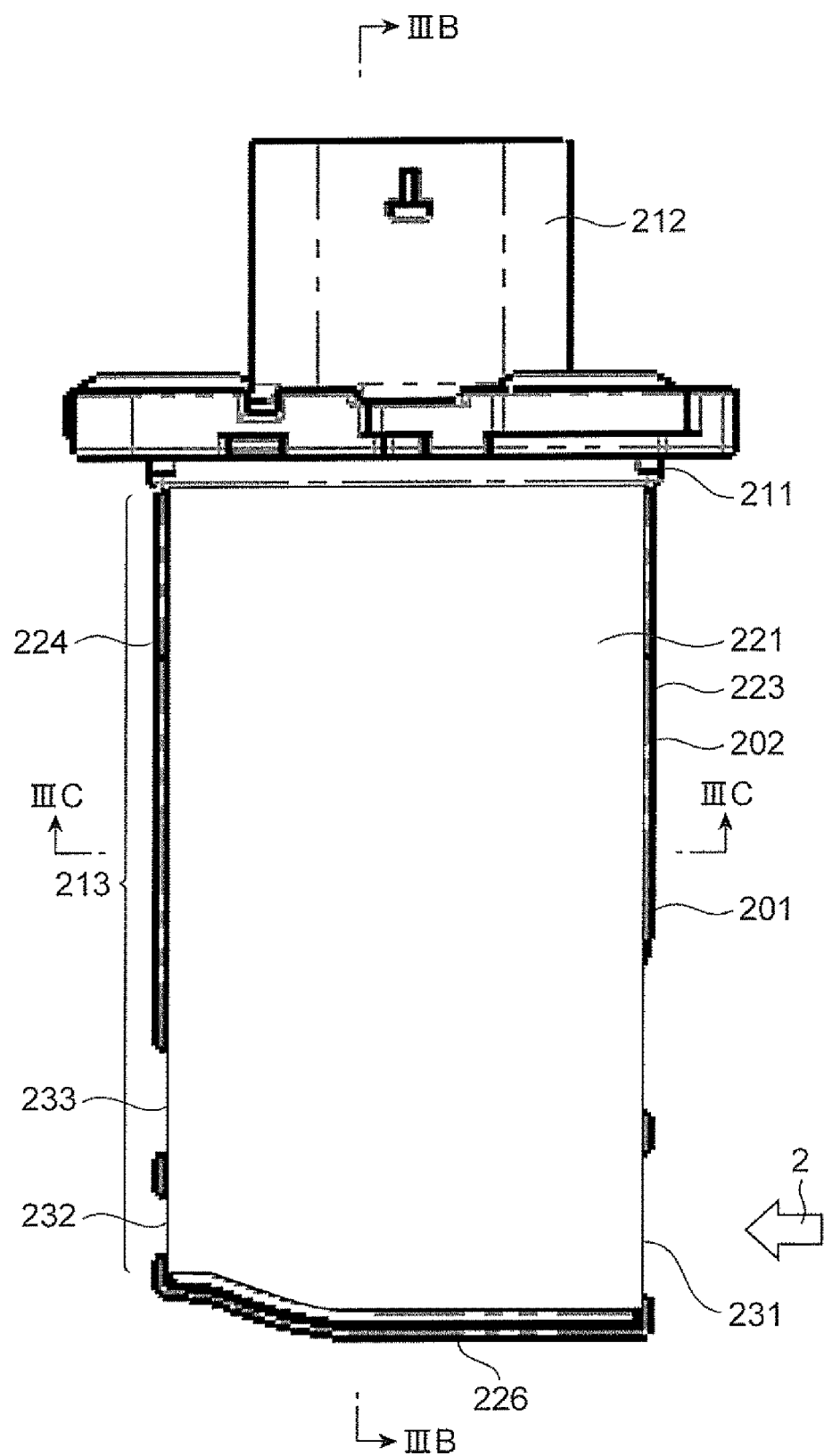
FIG. 2A is a front view of the physical quantity detecting device.
Figure 2B:
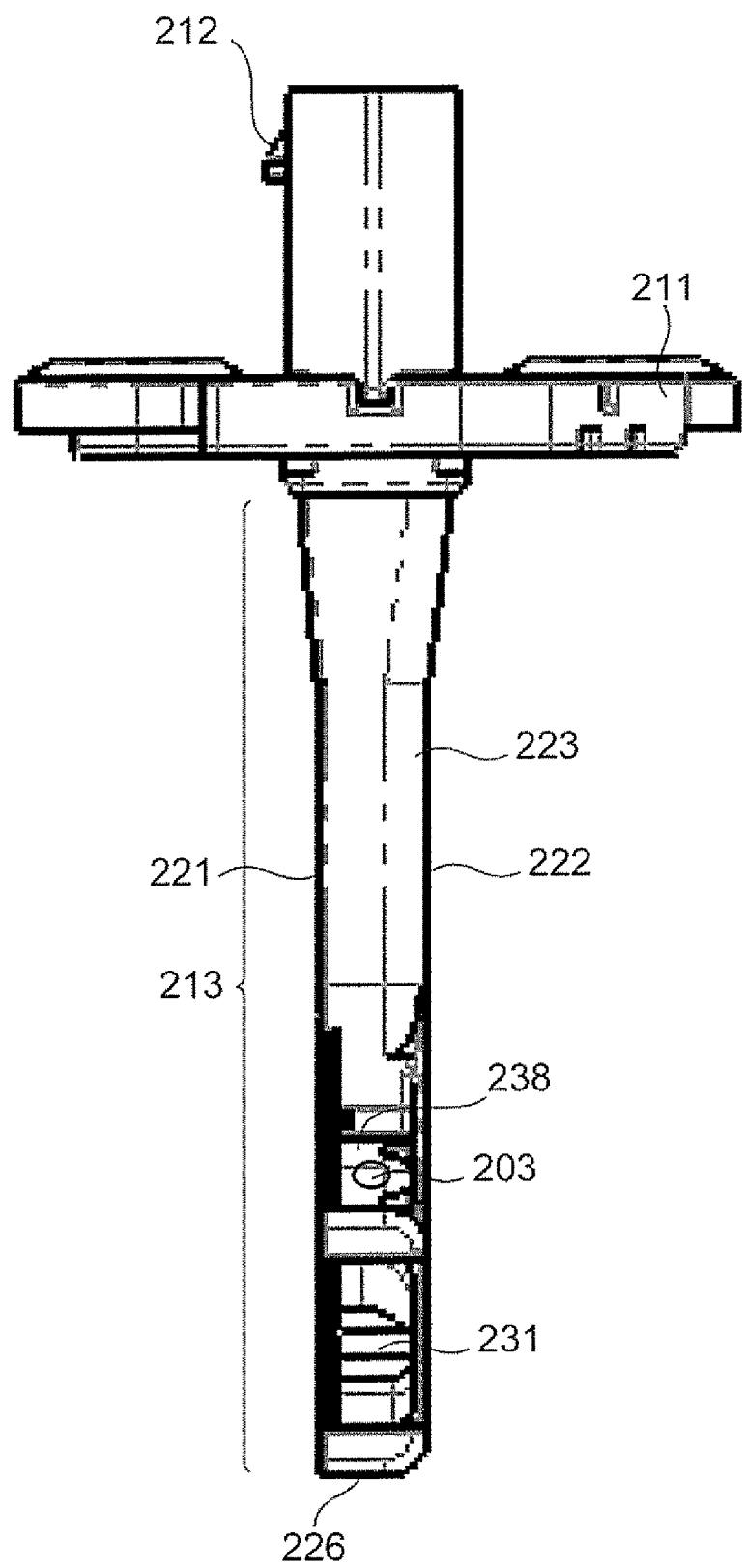
FIG. 2B is a right side view of the physical quantity detecting device.
Figure 2C:
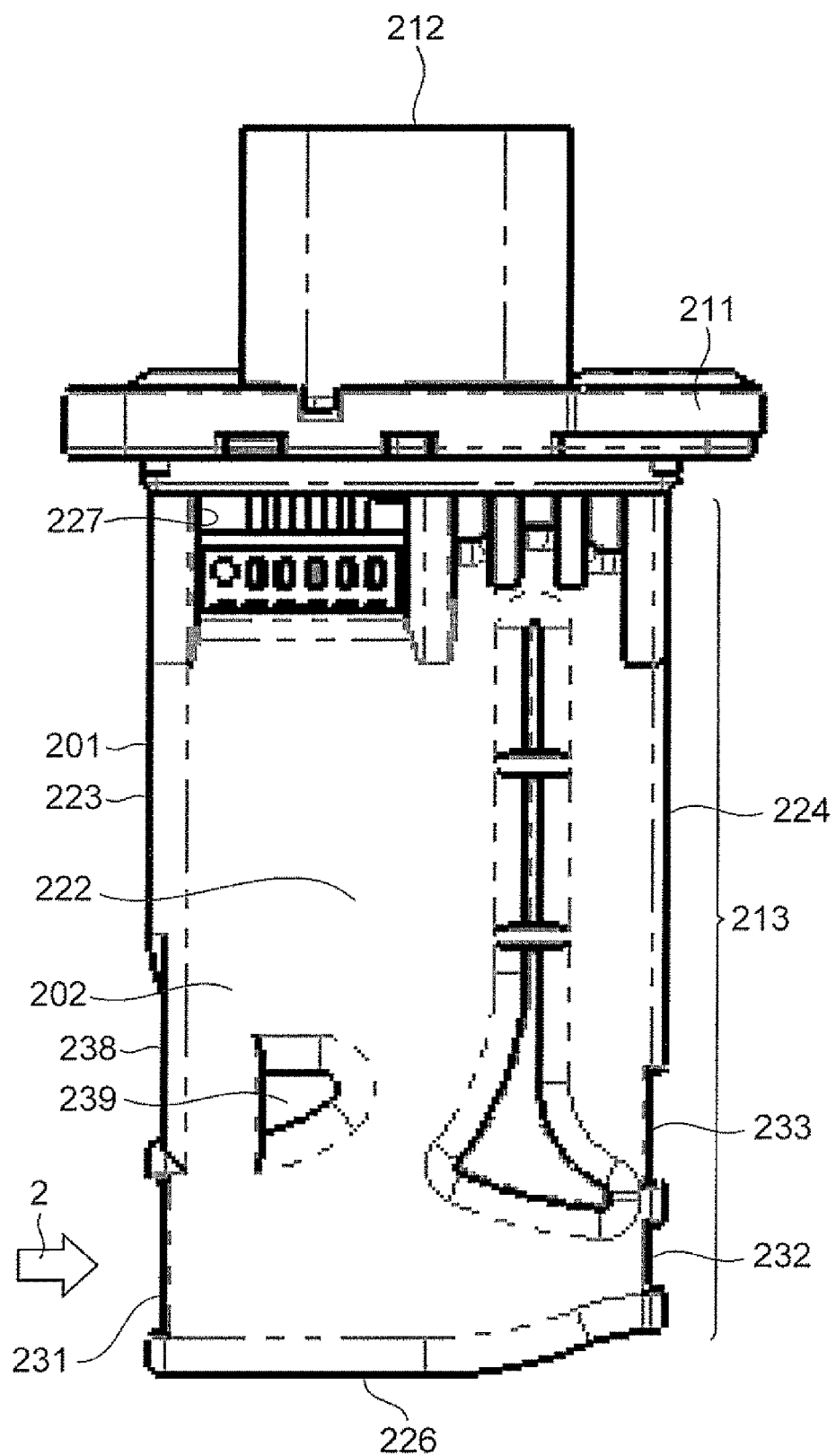
FIG. 2C is a back view of the physical quantity detecting device.
Figure 2D:
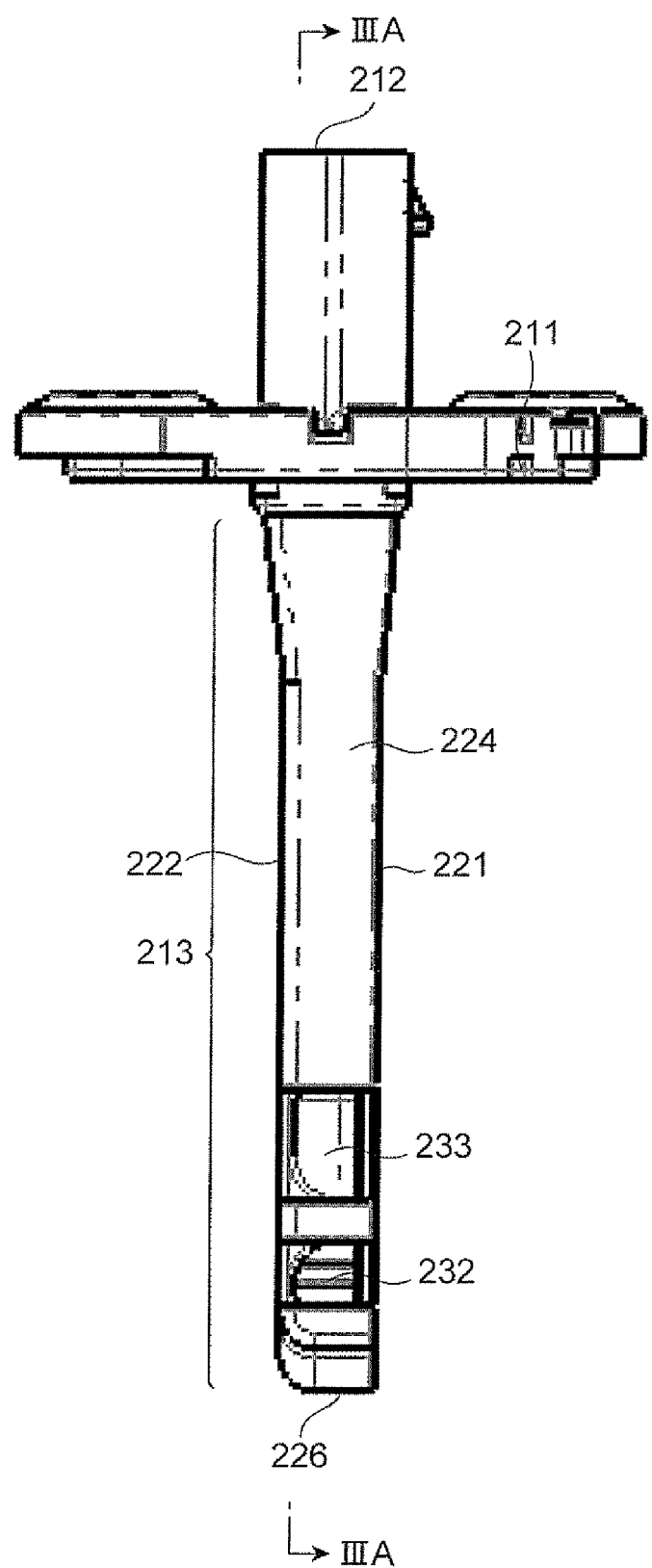
FIG. 2D is a left side view of the physical quantity detecting device.

The physical quantity detecting device 20 has a shape in which the measurement unit 213 extends to be long along the axis from an outer wall of the main passage 22 toward the center, and the widths of the side surfaces 223 and 224 have a narrow shape as illustrated in FIGS. 2B and 2D. As a result, the physical quantity detecting device 20 can suppress the fluid resistance of the gas 2 to be measured to a small value.

<Structure of Temperature Detection Unit>

In the physical quantity detecting device 20, an intake air temperature sensor 203, which is a temperature detection unit, is provided in the measurement unit 213 as illustrated in FIG. 2B. The intake air temperature sensor 203 is arranged in the middle of a passage of a temperature detection passage C having one end 238 open near the sub-passage inlet 231 and another end 239 open to the back surface 222 of the measurement unit 213. The temperature detection passage C is constituted by the housing 201 and the cover 202.

Figure 6A:
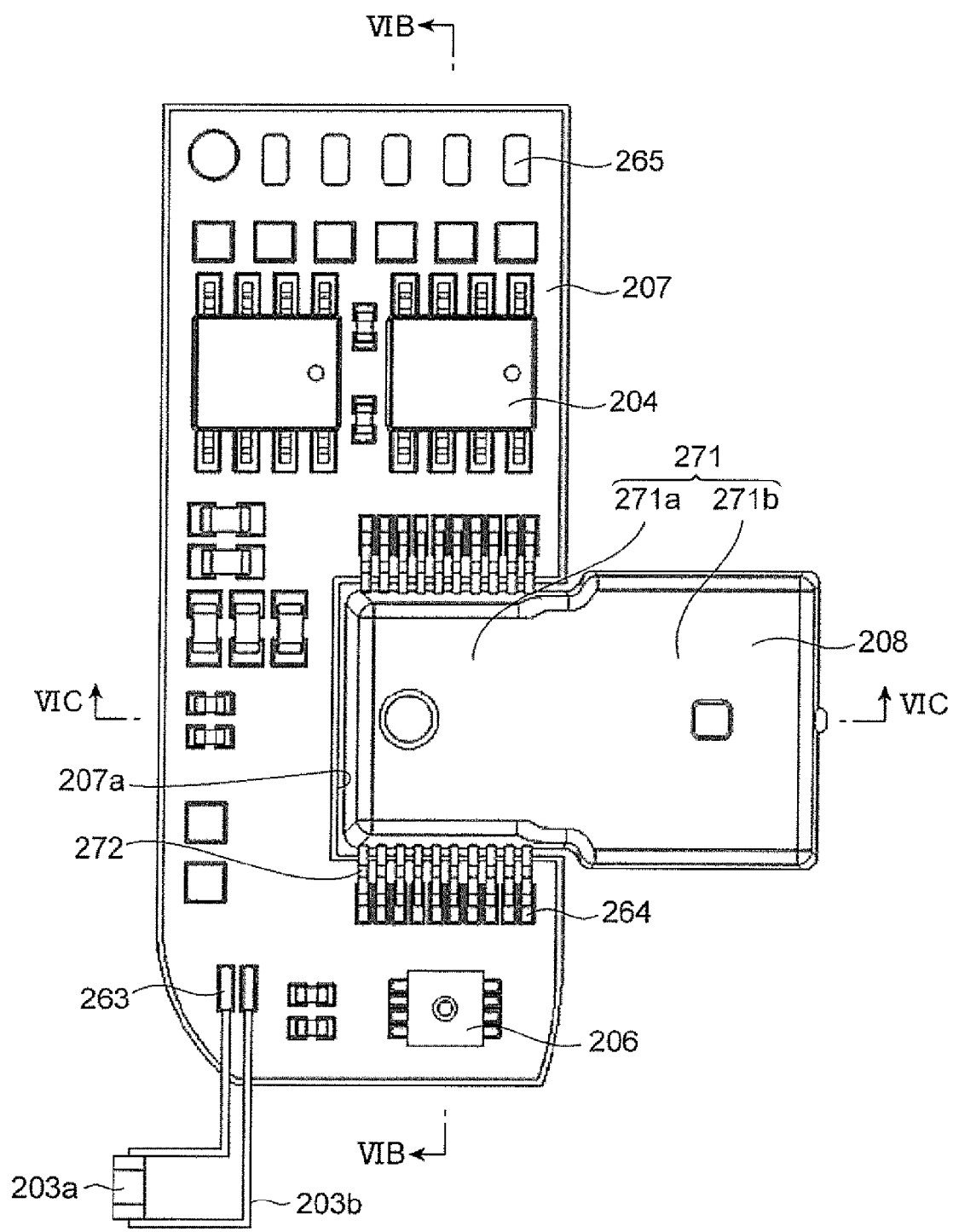
FIG. 6A is a front view of a circuit board on which a chip package and circuit components are mounted.

As illustrated in FIG. 6A, the intake air temperature sensor 203 is formed of an axial lead component having a columnar sensor body 203a and a pair of leads 203b which protrudes in directions away from each other from both axial end portions of the sensor body 203a. The intake air temperature sensor 203 is mounted on a circuit board 207 in the measurement unit 213 via the leads 203b. and the sensor body 203a is arranged to be orthogonal to the flow direction of the gas 2 to be measured in the temperature detection passage C.

Since the intake air temperature sensor 203 is arranged in the temperature detection passage C constituted by the housing 201 and the cover 202, it is possible to prevent the intake air temperature sensor 203 from coming into direct contact with another object and being damaged during transport or attachment work of the physical quantity detecting device 20.

According to the physical quantity detecting device 20 of the present embodiment, the intake air temperature sensor 203 is arranged on the upstream side of the measurement unit 213, and thus, it is possible to make the gas 2 to be measured flowing straight from the upstream side direct contact with the intake air temperature sensor 203. Therefore, heat dissipation properties of the intake air temperature sensor 203 can be improved.

<Structure of Flange>

Figure 2E:
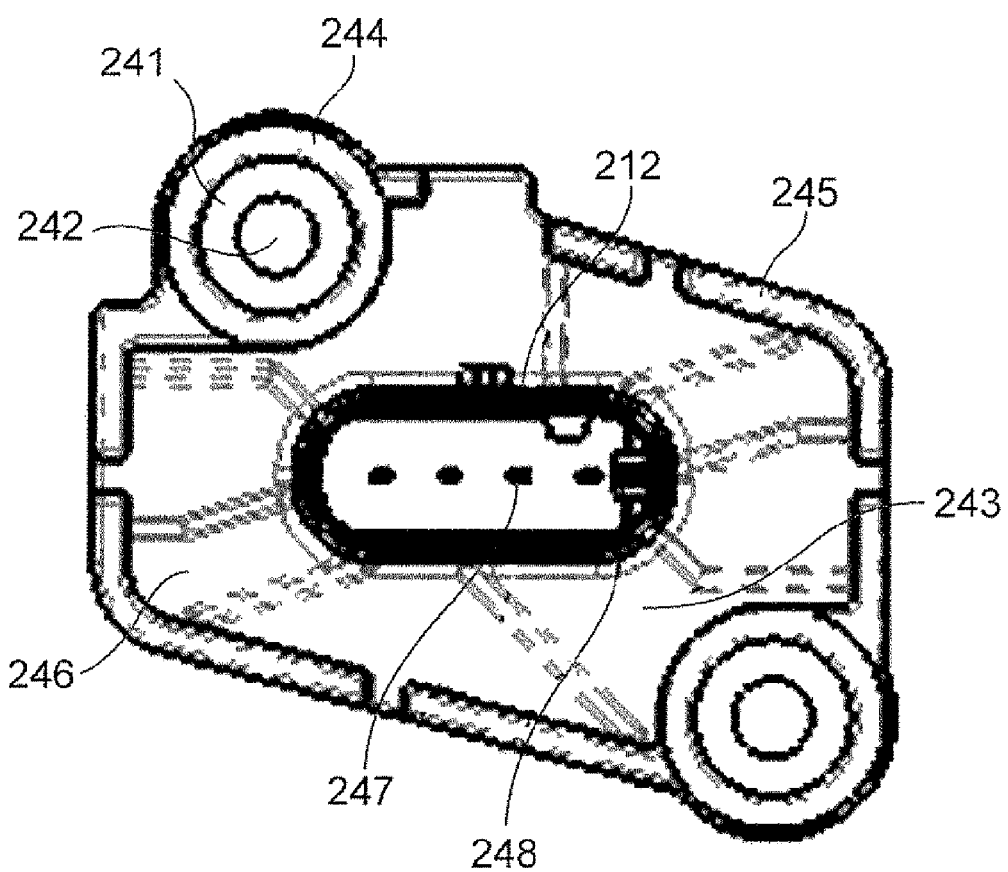
FIG. 2E is a plan view of the physical quantity detecting device.
Figure 2F:
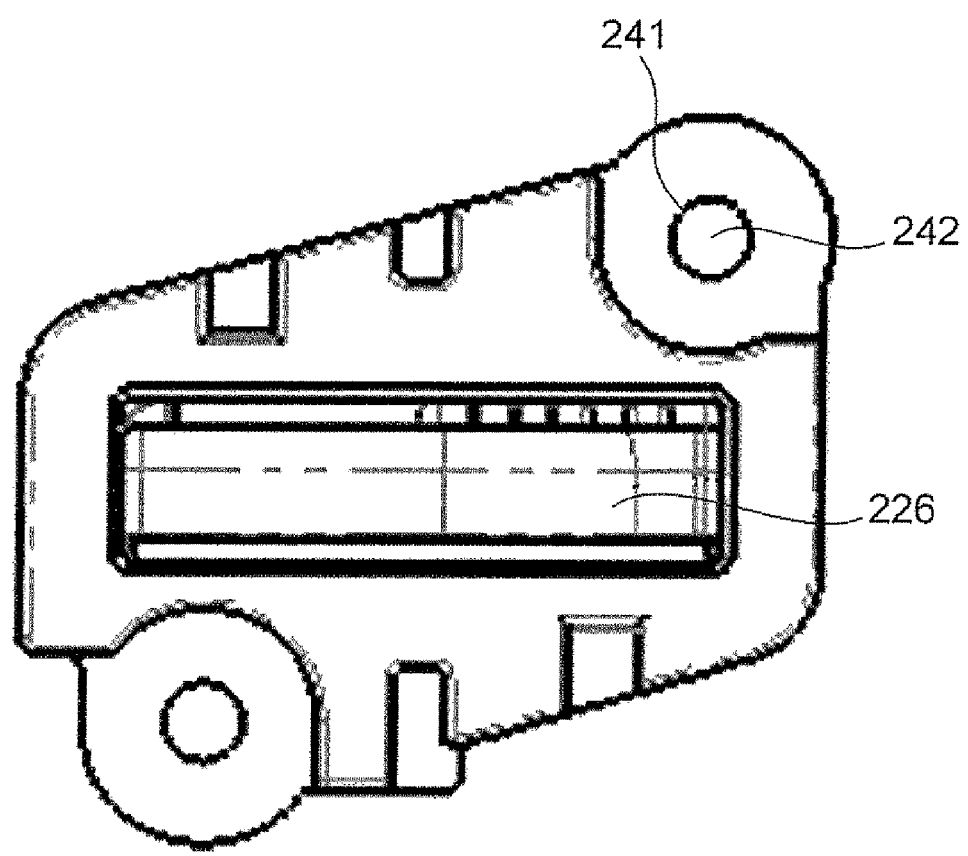
FIG. 2F is a bottom view of the physical quantity detecting device.

The measurement unit 213 of the physical quantity detecting device 20 is inserted inside through the attachment hole provided in the main passage 22, and the flange 211 of the physical quantity detecting device 20 abuts on the main passage 22, and is fixed to the main passage 22 with a screw. The flange 211 has a substantially rectangular shape in a plan view with a predetermined plate thickness, and a pair of fixing holes 241 is provided at diagonal corners as illustrated in FIGS. 2E and 2F. The fixing hole 241 has a through-hole 242 penetrating the flange 211. The flange 211 is fixed to the main passage 22 by inserting a fixing screw (not illustrated) into the through-hole 242 of the fixing hole 241 and screwing the screw into a screw hole of the main passage 22.

As illustrated in FIG. 2E, a plurality of ribs is provided on an upper surface of the flange 211. The ribs include: a first rib 243 that linearly connects the fixing hole 241 and the connector 212; a second rib 244 having a tapered cross section that surrounds the periphery of the through-hole 242 of the fixing hole 241; a third rib 245 provided along an outer peripheral portion of the flange 211; and a fourth rib 246 that extends in a direction of intersecting the first rib 243 on a diagonal of the flange 211.

The first rib 243 is linearly provided between the fixing hole 241 on which a screw fixing force acts on the main passage 22 and the connector 212 having a relatively high rigidity due to its three-dimensional shape, and thus, a flange reinforcing effect is high. Therefore, as compared with the one having no first rib 243, the thickness of the flange 211 can be reduced, the weight of the entire housing can be reduced, and it is possible to reduce the influence of shrinkage of resin constituting the flange 211 during molding of the housing 201.

As illustrated in FIG. 2E, the connector 212 is provided with four external terminals 247 and correction terminals 248 therein. The external terminals 247 serve as a terminal to output a physical quantity, such as a flow rate and temperature, which is a measurement result of the physical quantity detecting device 20, and a power supply terminal to supply DC power for the operation of the physical quantity detecting device 20.

The correction terminal 248 is a terminal used to measure the produced physical quantity detecting devices 20, obtain a correction value for each of the physical quantity detecting devices 20, and store the correction value in a memory inside the physical quantity detecting device 20. In the subsequent measurement operation of the physical quantity detecting device 20, correction data representing the above-described correction value stored in the memory is used, and the correction terminal 248 is not used.

Therefore, the correction terminal 248 has a shape different from that of the external terminal 247 such that the correction terminal 248 does not interfere when the external terminal 247 is connected to another external device. In the present embodiment, the correction terminal 248 has a shorter shape than the external terminal 247 so as not to interfere with the connection even if a connection terminal to the external device connected to the external terminal 247 is inserted into the connector 212.

<Overall Structure of Housing>

Figure 3A:
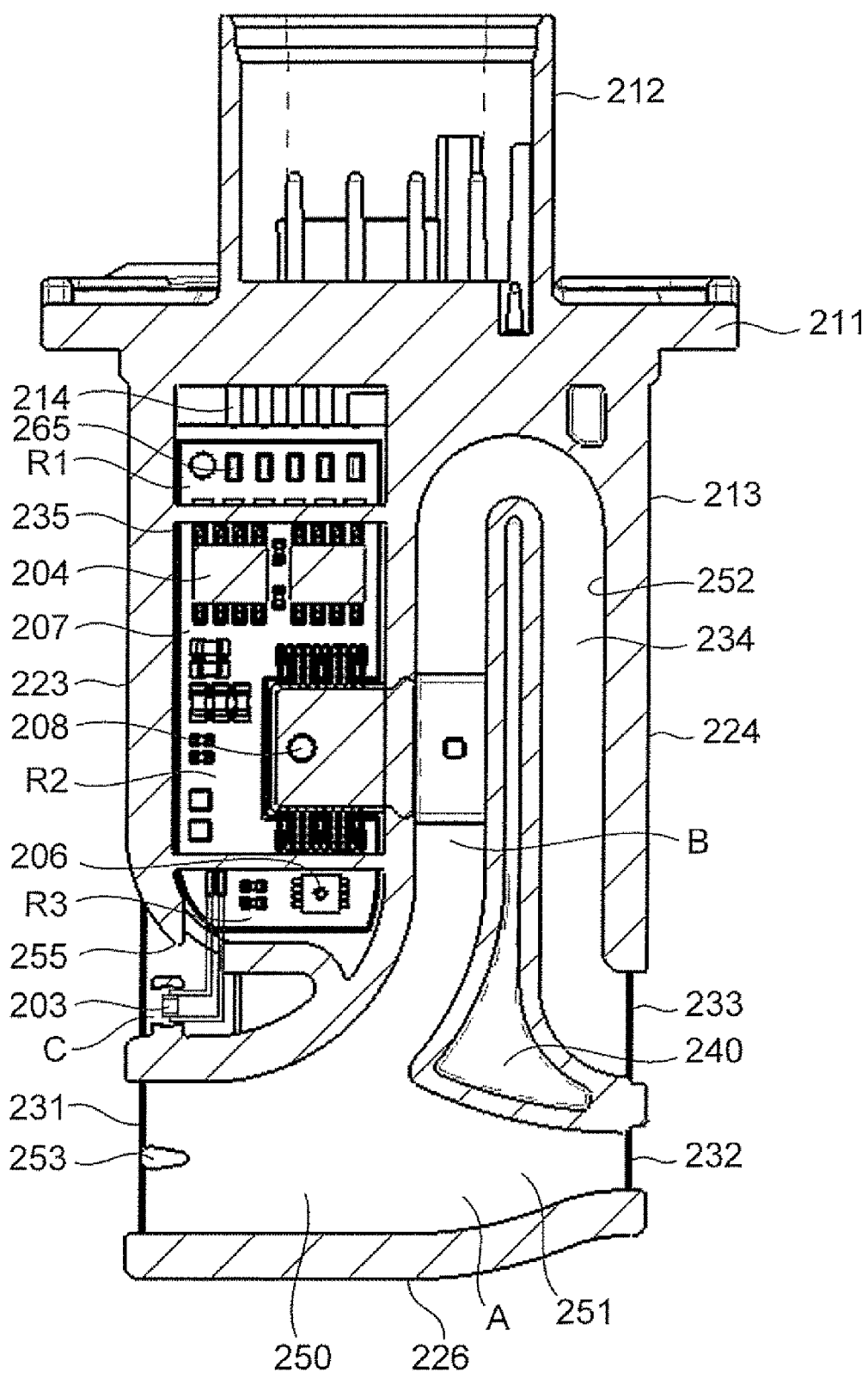
FIG. 3A is a cross-sectional view taken along the line IIIA-IIIA of FIG. 2D.
Figure 3B:
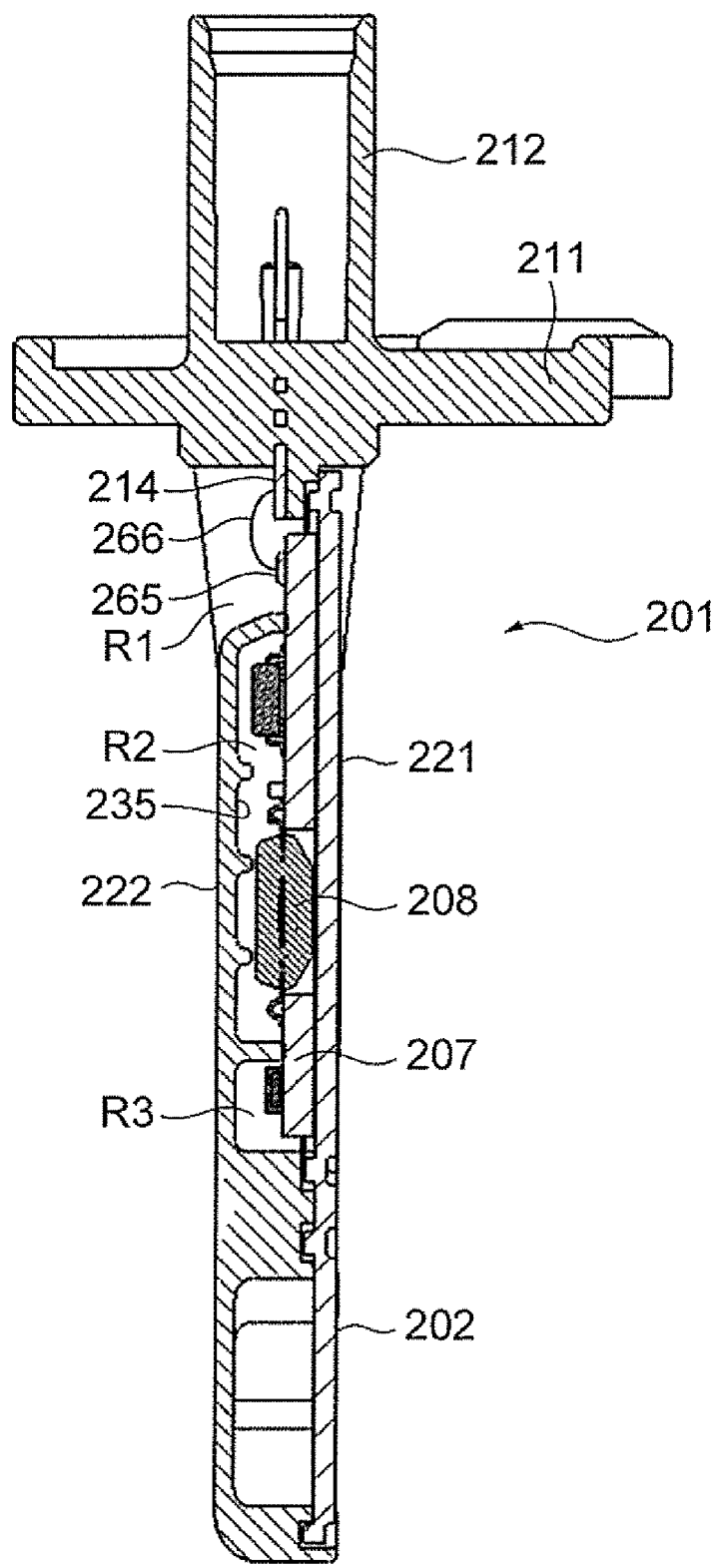
FIG. 3B is a cross-sectional view taken along the line IIIB-IIIB of FIG. 2A.
Figure 3C:
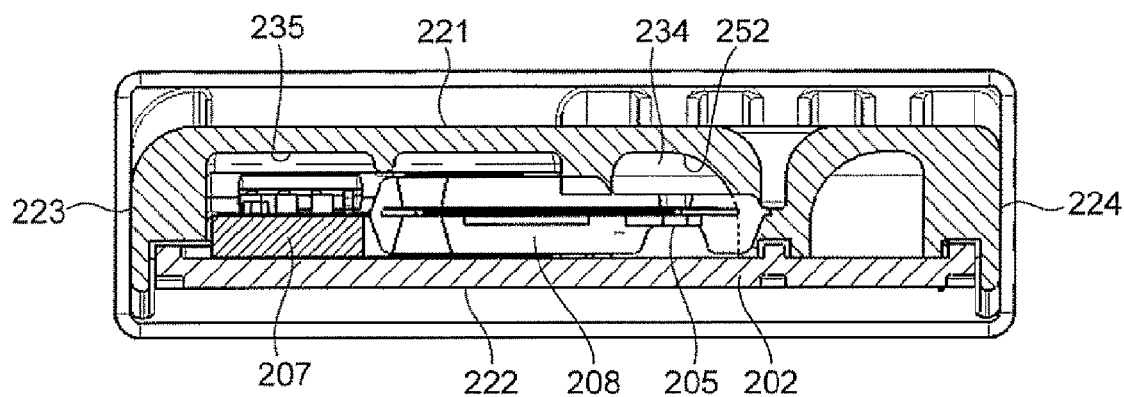
FIG. 3C is a cross-sectional view taken along the line IIIC-IIIC of FIG. 2A.
Figure 3D:
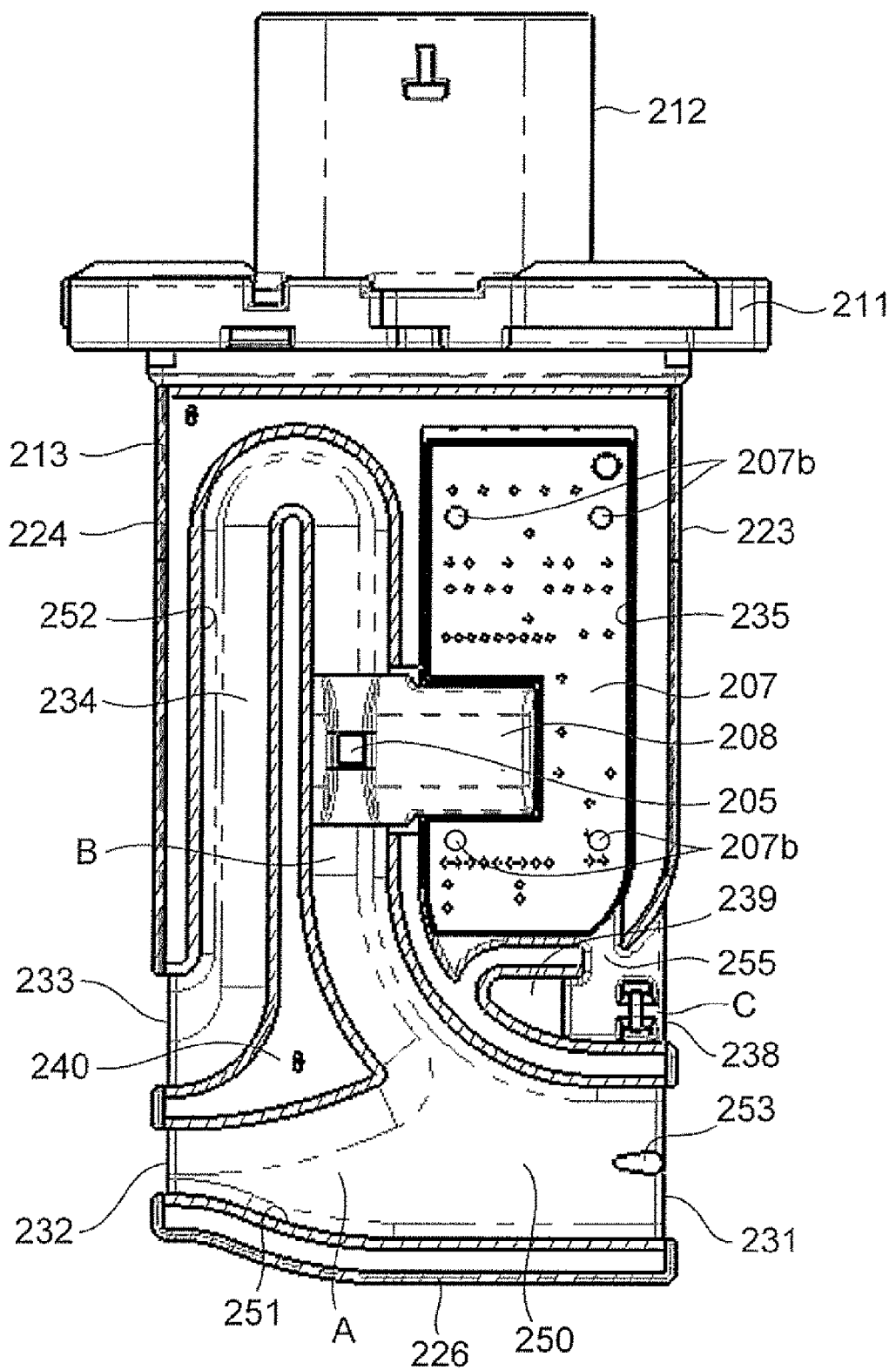
FIG. 3D is a front view of a housing from which only a cover has been removed.

FIG. 3A is a cross-sectional view taken along the line IIIA-IIIA of FIG. 2D, FIG. 3B is a cross-sectional view taken along the line IIIB-IIIB of FIG. 2A, FIG. 3C is a cross-sectional view taken along the line IIIC-IIIC of FIG. 2A, and FIG. 3D is a front view of a housing from which only the cover has been removed.

As illustrated in FIG. 3D, the housing 201 is provided with a sub-passage groove 250 configured to form the sub-passage 234 and a circuit chamber 235 configured to accommodate the circuit board 207. The circuit chamber 235 and the sub-passage groove 250 are provided to be recessed on the front surface of the measurement unit 213. The circuit chamber 235 is provided in a region on one side in the lateral direction (on the side surface 223 side) of the main passage 22 which is located on the upstream side in the flow direction of the gas 2 to be measured. Then, the sub-passage groove 250 is provided over a region closer to the distal end side (the lower surface 226 side) in the longitudinal direction of the measurement unit 213 than the circuit chamber 235 and a region closer to the other side (the side surface 224 side) in the lateral direction of the main passage 22, which is located on the downstream side in the flow direction of the gas 2 to be measured, than the circuit chamber 235.

The sub-passage groove 250 forms a sub-passage 234 in cooperation with the cover 202. The sub-passage groove 250 has a first sub-passage groove 251 and a second sub-passage groove 252 that branches in the middle of the first sub-passage groove 251. The first sub-passage groove 251 is formed to extend along the lateral direction of the measurement unit 213 between the sub-passage inlet 231 that is open on the side surface 223 on one side of the measurement unit 213 and the first outlet 232 open on the side surface 224 on the other side of the measurement unit 213. The first sub-passage groove 251 forms a first sub-passage A that takes the gas 2 to be measured flowing in the main passage 22 from the sub-passage inlet 231 and returns the taken gas 2 to be measured from the first outlet 232 to the main passage 22. The first sub-passage A extends from the sub-passage inlet 231 along the flow direction of the gas 2 to be measured in the main passage 22, and is connected to the first outlet 232.

The second sub-passage groove 252 branches at an intermediate position of the first sub-passage groove 251, is bent toward a proximal end portion side (flange side) of the measurement unit 213, and extends along the longitudinal direction of the measurement unit 213. Then, the second sub-passage groove 252 is bent at the proximal end portion of the measurement unit 213 toward the other side (side surface 224 side) in the lateral direction of the measurement unit 213, makes a U-turn toward the distal end portion of the measurement unit 213, and extends again along the longitudinal direction of the measurement unit 213. Then, the second sub-passage groove 252 is bent in front of the first outlet 232 toward the other side in the lateral direction of the measurement unit 213, and is provided to be continuous with the second outlet 233 that is open to the side surface 224 on the other side of the measurement unit 213. The second outlet 233 is arranged so as to face the downstream side in the flow direction of the gas 2 to be measured in the main passage 22. The second outlet 233 has an opening area substantially equal to or slightly larger than that of the first outlet 232, and is formed at a position more adjacent to the proximal end portion side in the longitudinal direction of the measurement unit 213 than the first outlet 232.

The second sub-passage groove 252 forms a second sub-passage B which allows the gas 2 to be measured having branched and flowed from the first sub-passage A to pass therethrough to return the gas 2 to be measured from the second outlet 233 to the main passage 22. The second sub-passage B has a path that reciprocates along the longitudinal direction of the measurement unit 213. That is, the second sub-passage B has a path that branches in the middle of the first sub-passage A, extends toward the proximal end portion side of the measurement unit 213, is folded back at the proximal end portion side of the measurement unit 213 to extend toward the distal end portion side of the measurement unit 213, and leads to the second outlet 233 which is arranged on the downstream side of the sub-passage inlet 231 in the flow direction of the gas 2 to be measured in the main passage 22 to face the downstream side in the flow direction of the gas 2 to be measured. The second sub-passage B has a flow rate detection unit 205 arranged at an intermediate position thereof. Since the second sub-passage B is formed so as to extend and reciprocate along the longitudinal direction of the measurement unit 213, the length of the passage can be secured longer, and the influence on the flow rate detection unit 205 can be reduced when a pulsation occurs in the main passage.

According to the above configuration, the physical quantity detecting device 20 can include the sub-passage 234 having a sufficient length. Therefore, the physical quantity detecting device 20 can measure the physical quantity of the gas 2 to be measured with high accuracy while suppressing the fluid resistance to the small value.

The first sub-passage A is provided to extend from the sub-passage inlet 231 to the first outlet 232 along the lateral direction of the measurement unit 213, and thus, foreign matter such as dust that has entered the first sub-passage A from the sub-passage inlet 231 can be discharged directly from the first outlet 232. Therefore, it is possible to prevent the foreign matter from entering the second sub-passage B and prevent the flow rate detection unit 205 in the second sub-passage B from being affected.

The sub-passage inlet 231 and the first outlet 232 of the first sub-passage groove 251 have a larger opening area at the sub-passage inlet 231 than at the first outlet 232. Since the opening area of the sub-passage inlet 231 is larger than that of the first outlet 232, the gas 2 to be measured that has flowed into the first sub-passage A can be reliably guided to the second sub-passage B that branches in the middle of the first sub-passage A.

At the sub-passage inlet 231 of the first sub-passage groove 251, a protrusion 253 is provided at a central position in the longitudinal direction. The protrusion 253 divides a size of the sub-passage inlet 231 into two equal parts in the longitudinal direction to make each part have a smaller opening area than the first outlet 232 and the second outlet 233. The protrusion 253 regulates a size of foreign matter that can enter the first sub-passage A from the sub-passage inlet 231 only to a size smaller than the first outlet 232 and the second outlet 233, and can prevent the first outlet 232 and the second outlet 233 from being blocked by foreign matter.

<Structure of Single Housing>

Figure 4A:
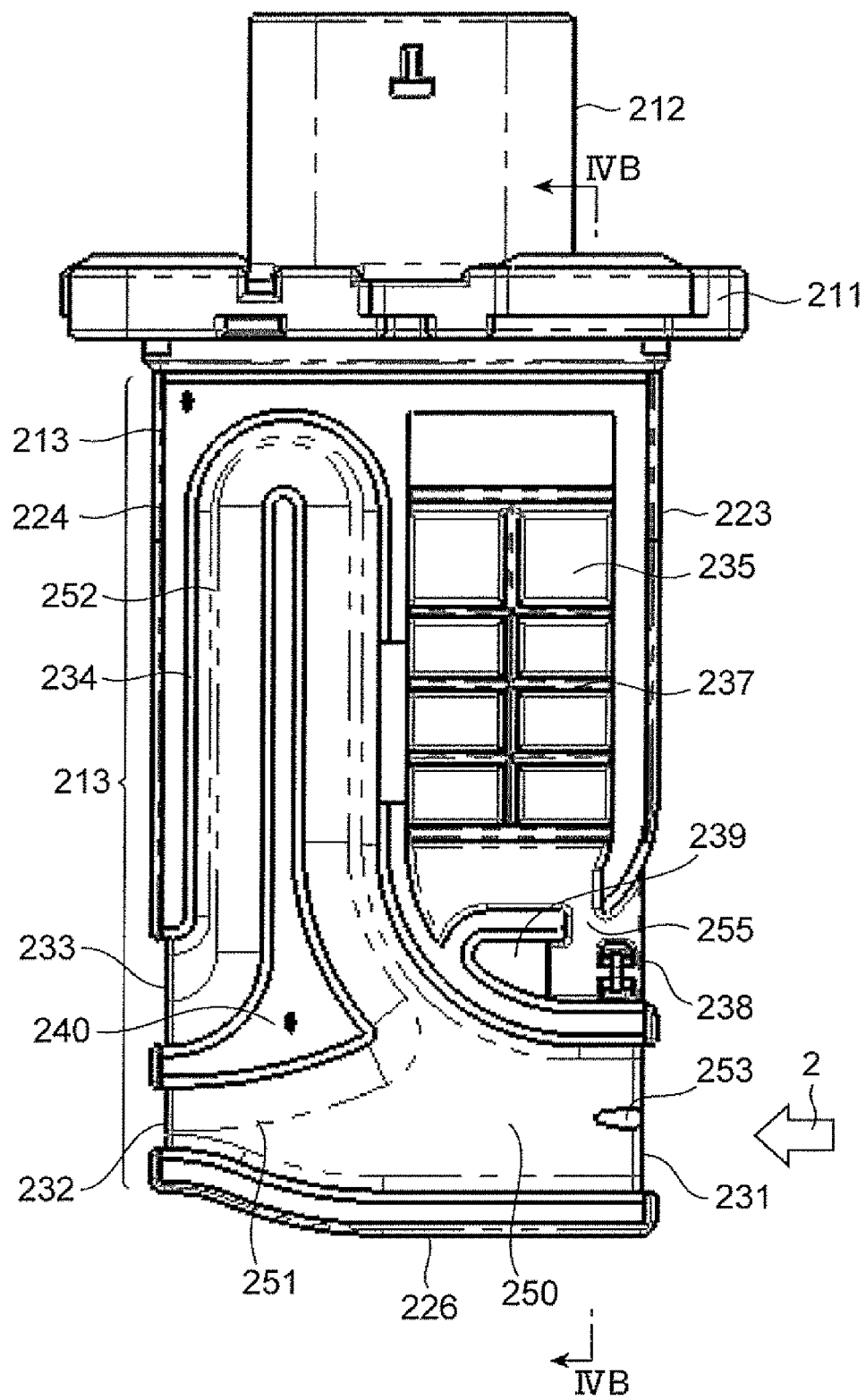
FIG. 4A is a front view of the housing from which a cover assembly has been removed.
Figure 4B:
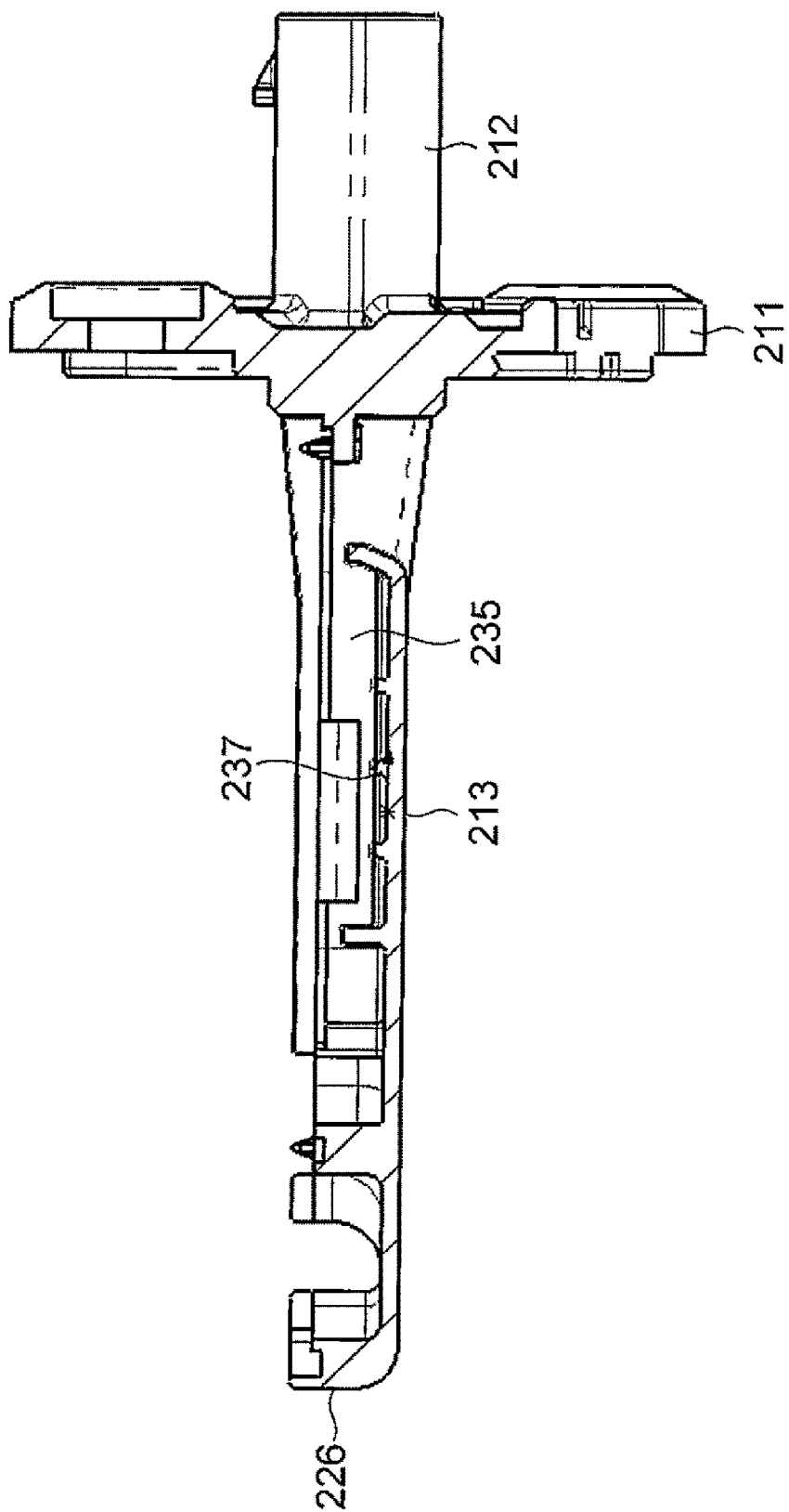
FIG. 4B is a cross-sectional view taken along the line IVB-IVB of FIG. 4A.

FIG. 4A is a front view of the housing from which a cover assembly has been removed, and FIG. 4B is a cross-sectional view taken along the line IVB-IVB of FIG. 4A.

As illustrated in FIG. 4A, the housing 201 is provided with ribs 237 on a bottom surface of the circuit chamber 235. The ribs 237 include a plurality of vertical ribs extending along the longitudinal direction of the measurement unit 213 and a plurality of horizontal ribs extending along the lateral direction of the measurement unit 213, and are provided in a grid pattern.

Since the measurement unit 213 is provided with the ribs 237, the housing 201 can obtain high rigidity without increasing the thickness. The thickness of the housing 201 greatly differs between the flange 211 and the measurement unit 213, a difference in heat shrinkage after injection molding is large, and the measurement unit 213, which is thinner than the flange 211, is easily deformed. Therefore, it is possible to suppress the distortion of the measurement unit 213 at the time of heat shrinkage by providing the grid-shaped ribs 237 that spread in a planar shape on the bottom surface of the circuit chamber 235.

The housing 201 is provided with the ribs 237 not on an outer wall of the measurement unit 213 but on the bottom surface of the circuit chamber 235. In the case of being provided on the outer wall of the measurement unit 213, there is a possibility that the ribs 237 may be affected by the flow of the gas 2 to be measured passing through the main passage 22. In addition, for example, when the depth of the circuit chamber 235 is set on the assumption that the circuit board 207 with one-side mounting is accommodated, the depth of the circuit chamber 235 needs to be increased if the specifications are changed to accommodate the circuit board 207 with double-sided mounting. However, if the ribs are provided on the outer wall of the measurement unit 213, the ribs protrude by an increase in the depth of the circuit chamber 235 so that the thickness of the measurement unit 213 increases. Therefore, the thickness of the measurement unit 213 is different between the one-side mounting and the double-sided mounting, which is likely to affect the detection accuracy.

On the other hand, the ribs 237 are provided on the bottom surface of the circuit chamber 235 in the present embodiment, and thus, it is possible to prevent the influence on the flow of the gas 2 to be measured passing through the main passage 22 and to allow the gas 2 to be measured to flow smoothly. Then, the depth of the bottom surface of the circuit chamber 235 can be changed simply by changing the height of the rib 237 in the circuit chamber 235, and it is unnecessary to change the thickness of the measurement unit regardless of whether the circuit board 207 corresponds to the one-side mounting or the double-sided mounting.

<Structure of Cover Assembly>

Figure 5:
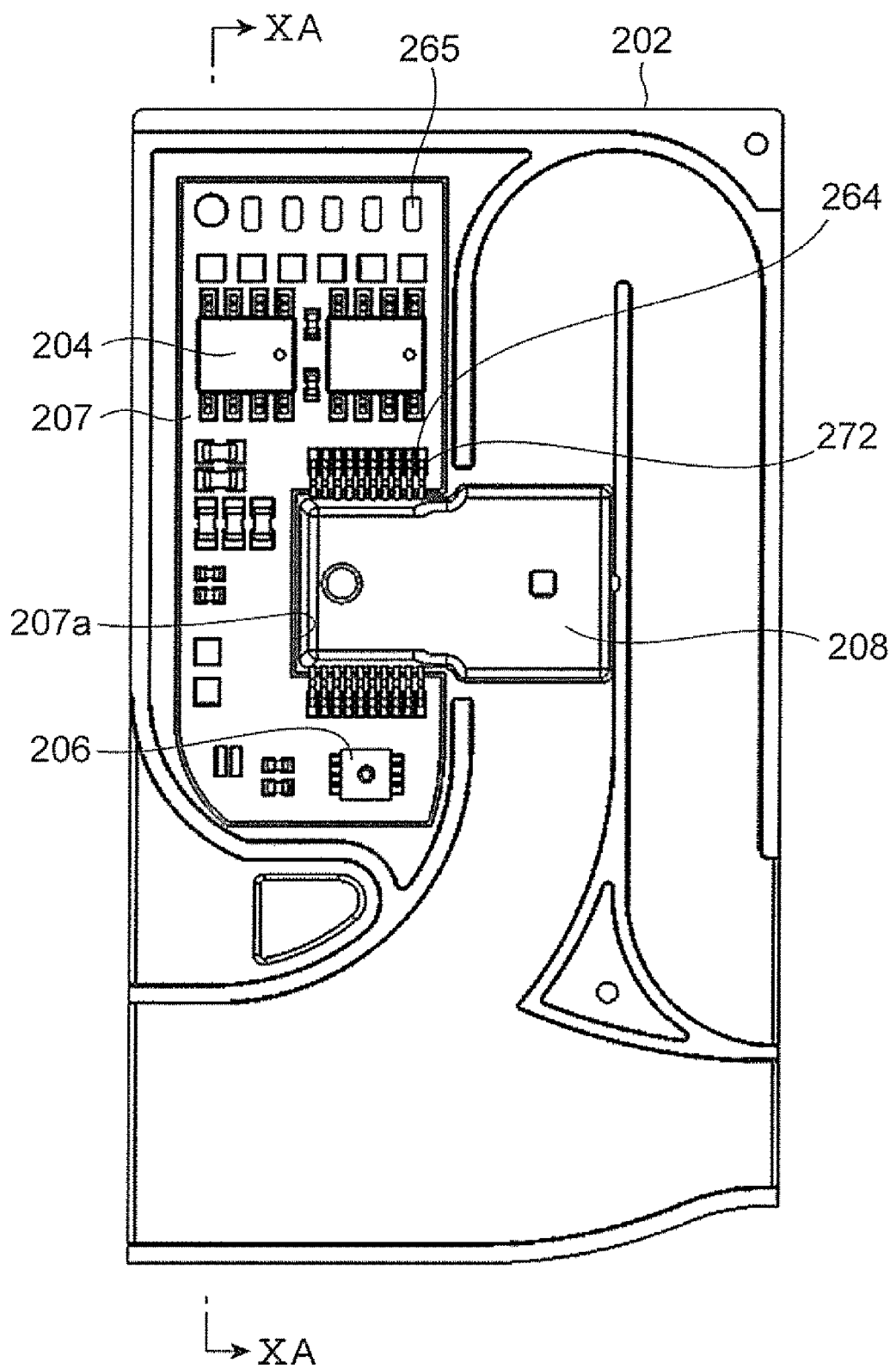
FIG. 5 is a view illustrating a configuration of the cover assembly.

FIG. 5 is a view illustrating a configuration of the cover assembly.

The cover assembly is constituted by the cover 202, which is a conductive base member, and the circuit board 207 on which a chip package 208 is mounted. The cover 202 is formed using a conductive material made of metal, for example, an aluminum alloy, a stainless alloy, or the like, but may be made of, for example, a conductive resin material without being limited to metal. The cover 202 is a flat plate member having a size that covers the front surface of the measurement unit 213, and is fixed to the measurement unit 213 with an adhesive. In addition, the cover 202 covers the circuit chamber 235 of the measurement unit 213, and forms a sub-passage in cooperation with the sub-passage groove 250 of the measurement unit 213.

The cover 202 forms a part of the sub-passage 234. The dust that has flowed into the sub-passage 234 together with the gas 2 to be measured passes along the back surface of the cover 202. The cover 202 has a fixed potential, and dust passing through the back surface of the cover 202 is statically eliminated, and adhesion of dust to the flow rate detection unit 205 can be suppressed, so that the stain resistance can be improved. The cover 202 forms the sub-passage 234, and is a necessary component regardless of the presence or absence of static elimination, so that an additional component for static elimination is unnecessary.

The circuit board 207 on which the chip package 208 is mounted is fixed to the back surface of the cover 202, that is, the surface to be attached to the housing 201. The circuit board 207 is formed using, for example, a printed board made of glass epoxy (glass epoxy board), and has a rectangular shape extending along the longitudinal direction of the measurement unit 213. A notch is provided at a central position in the longitudinal direction of the circuit board 207, and an accommodating portion 207a for accommodation of a part of the chip package 208 is configured. The chip package 208 is fixed to the circuit board 207 at the central position in the longitudinal direction of the circuit board 207 in a state of protruding laterally from an end portion along the lateral direction of the circuit board 207.

The cover assembly accommodates the circuit board 207 in the circuit chamber 235 by attaching the cover 202 to the housing 201, and allows the chip package 208 to extend between the sub-passage 234 and the circuit chamber 235 so that the flow rate detection unit 205 of the chip package 208 can be arranged in the second sub-passage B.

<Sealing Structure in Circuit Chamber>

In the circuit chamber 235, a hatched portion in FIG. 3D is bonded to the cover 202 with an adhesive. As illustrated in FIG. 3A, the front side of the circuit board 207 is hermetically partitioned into three rooms R1, R2, and R3 in the circuit chamber 235. Specifically, the first room R1 to which a connector terminal 214 integrally molded with the housing 201 and a pad 265 of the circuit board 207 are connected, the second room R2 for accommodation of a pressure sensor 204 and a part of the chip package 208, and a third room R3 in which a temperature and humidity sensor 206 is accommodated and the lead 203b of the intake air temperature sensor 203 is inserted are formed.

The first room R1 is sealed by the cover 202 on the front side, and is open by an opening 227 of the housing 201 on the back side as illustrated in FIG. 2C. However, the opening 227 is filled with a resin material after the connector terminal 214 and the pad 265 of the circuit board 207 are electrically connected by a bonding wire 266. That is, the first room R1 is a hermetically sealed space that is isolated from the outside of the measurement unit 213 by sealing the front side and the back side. Therefore, a connection portion between the connector terminal 214 and the pad 265 can be prevented from coming into contact with a gas contained in the gas 2 to be measured and corroding.

The second room R2 communicates with the sub-passage 234 through a gap between the second room R2 and the cover 202. The pressure sensor 204 is mounted on the circuit board 207 at a position arranged in the second room R2. Therefore, the pressure sensor 204 can measure the pressure in the second room R2. The third room R3 communicates with the temperature detection passage C, and communicates with the outside of the measurement unit 213 via an R3 inlet 255. The temperature and humidity sensor 206 is mounted on the circuit board 207 at a position arranged in the third room R3. Therefore, the temperature and humidity sensor 206 can measure the temperature and humidity in the third room R3.

<Structure of Circuit Board>

Figure 6C:
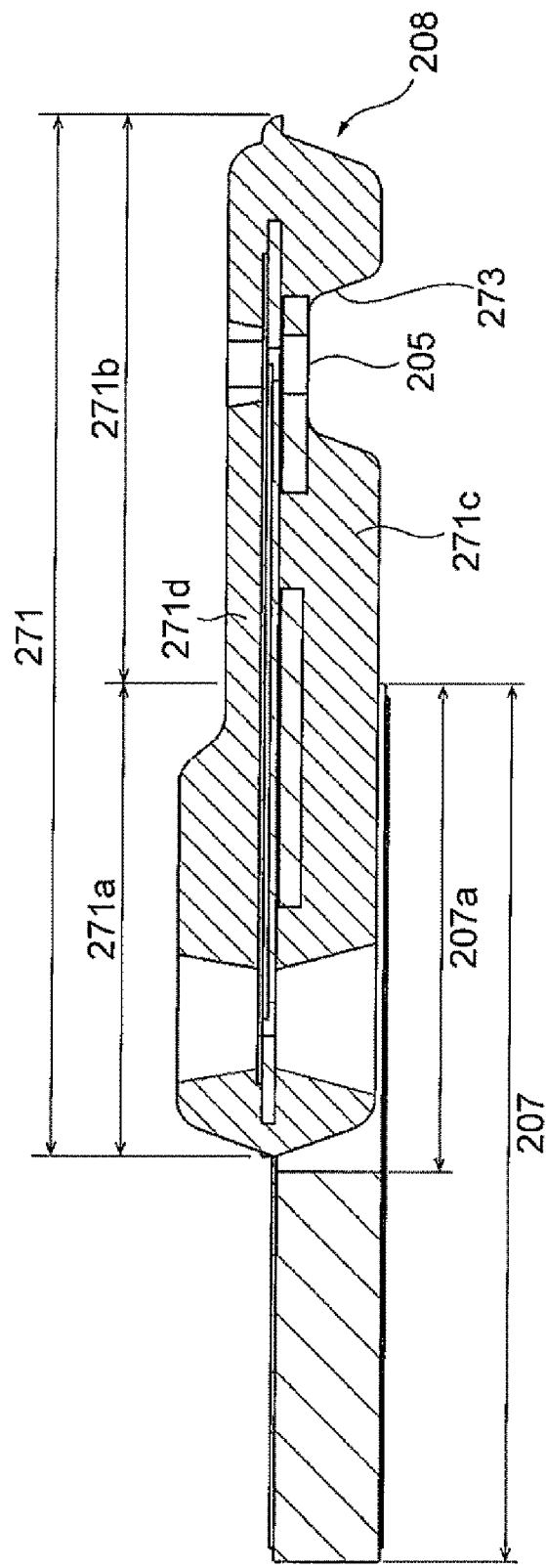
FIG. 6C is a cross-sectional view taken along the line VIC-VIC of FIG. 6A.

FIG. 6A is a front view of the circuit board on which the chip package and circuit components are mounted, FIG. 6B is a cross-sectional view taken along the line VIB-VIB of FIG. 6A, and FIG. 6C is a cross-sectional view taken along the line VIC-VIC of FIG. 6A.

Figure 7A:
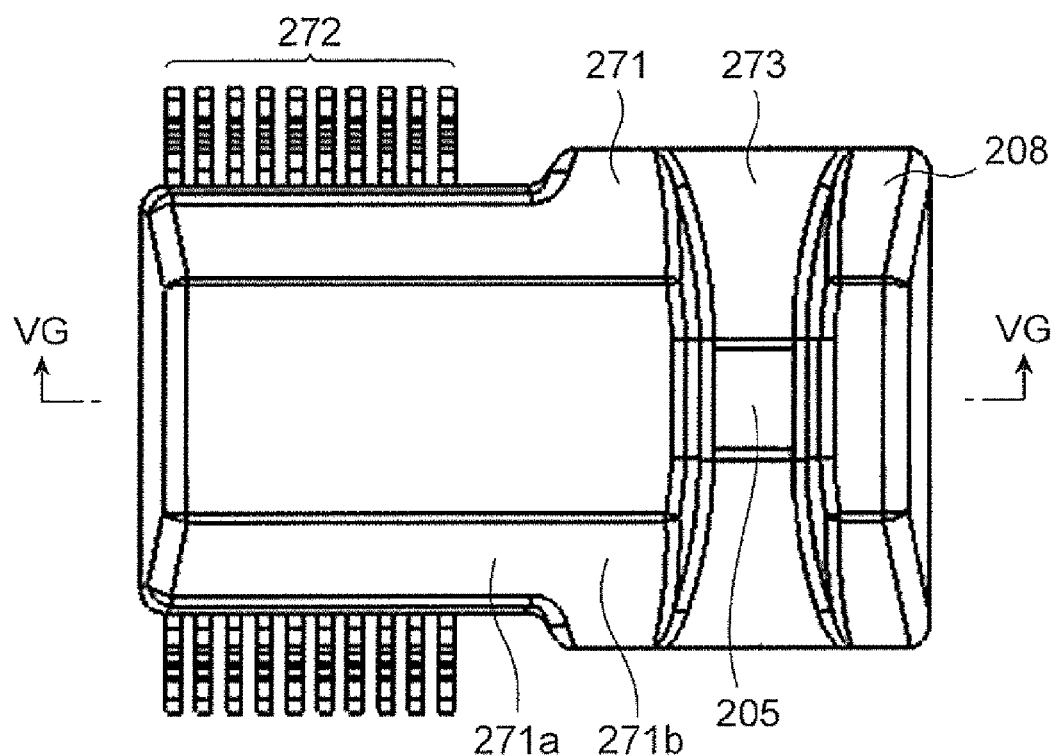
FIG. 7A is a front view of the chip package.

The circuit board 207 has a rectangular shape along the longitudinal direction of the measurement unit 213 as a whole. The circuit board 207 has an accommodating portion 207a configured to accommodate a part of the chip package 208. As illustrated in FIG. 7A, the accommodating portion 207a is formed by partially cutting out a portion of the circuit board 207 that is biased toward the center in the longitudinal direction and one side in the lateral direction (notch portion), and the circuit board 207 has a substantially U-shape in a plan view.

In the chip package 208, at least a part of a package body 271 in the thickness direction enters the accommodating portion 207a of the circuit board 207 to be accommodated therein. Specifically, as illustrated in FIGS. 6B and 6C, the package body 271 is accommodated in a state where a package front surface portion 271c, which is a proximal end portion 271a of the package body 271 and a portion of the package body 271 on which the flow rate detection unit 205 is provided, enters the accommodating portion 207a of the circuit board 207.

Since the package front surface portion 271c, which is a part of the package body 271 in the thickness direction, is accommodated in the accommodating portion 207a of the circuit board 207 in the present embodiment, the overall mounting height including the thickness of the chip package 208 and the height of the terminal can be suppressed. As a result, for example, the mounting height can be reduced to the same as that of the small pressure sensor mounted on the circuit board 207 together with the chip package 208. In addition, the mounting height of the mounting components can be suppressed to be lower as compared with a case where the chip package 208 is mounted on the circuit board 207 in an overlapping manner. Therefore, the height of the measurement unit 213 can be reduced, the physical quantity detecting device 20 can be made thin as illustrated in FIG. 3B, and the flow resistance in the main passage can be reduced. Incidentally, the case where the package front surface portion 271c of the package body 271 is accommodated in the accommodating portion 207a of the circuit board 207 has been described as an example in the present embodiment, but it may be configured such that the entire package body 271 in the thickness direction is accommodated. With such a configuration, it is possible to further promote the height reduction of the measurement unit 213 and to reduce the thickness of the physical quantity detecting device 20.

<Arrangement Position of Each Sensor>

As illustrated in FIG. 6A, the chip package 208, the pressure sensor 204, and the temperature and humidity sensor 206 are mounted on the circuit board 207. The chip package 208 is provided with a plurality of connection terminals 272 protruding from the proximal end portion 271a of the package body 271, and is fixed to the circuit board 207 as these connection terminals 272 are connected to pads 264 of the circuit board 207 by soldering. The flow rate detection unit 205 and an LSI, which is an electronic component that drives the flow rate detection unit 205, are mounted on the chip package 208. The flow rate detection unit 205 is provided at a distal end portion 271b of the package body 271. The chip package 208 forms a support body on which a semiconductor element having the flow rate detection unit 205 and the LSI as a processing unit are mounted.

In the embodiment illustrated in FIGS. 6A to 6C, the chip package 208 is attached to the circuit board 207 such that the package front surface portion 271c, which is one side in the thickness direction of the chip package 208, is located on the back surface side of the circuit board 207, that is, on the surface facing the cover 202. Therefore, the flow rate detection unit 205 can be arranged so as to oppose the cover 202, which is a conductive member, and static elimination can be performed on the gas 2 to be measured flowing to the flow rate detection unit 205.

This static elimination prevents dust contained in the gas 2 to be measured from being charged, deposition of the dust on and around the flow rate detection unit 205 caused by an adsorption force of the charge can be suppressed, and the high detection accuracy of the flow rate detection unit 205 can be maintained.

The pressure sensor 204 is mounted to be closer to one side of the circuit board 207 in the longitudinal direction than the chip package 208, and the temperature and humidity sensor 206 is mounted to be closer to the other side of the circuit board 207 in the longitudinal direction than the chip package 208. Then, the lead 203b of the intake air temperature sensor 203 is connected to the circuit board 207. The intake air temperature sensor 203 is mounted to be arranged at a position where the lead 203b is connected to a position closer to the other side of the circuit board 207 in the longitudinal direction than the temperature and humidity sensor 206, and the sensor body 203a protrudes from the circuit board 207 in the longitudinal direction to be exposed to the outside of the measurement unit 213.

On the measurement unit 213, (1) the pressure sensor 204, (2) the flow rate detection unit 205, (3) the temperature and humidity sensor 206, and (4) the intake air temperature sensor 203 are arranged in this order along the longitudinal direction from the proximal end portion side to the distal end portion side (in a protruding direction of the measurement unit 213). (1) The pressure sensor 204 detects the pressure of the gas 2 to be measured, and the flow rate detection unit 205 detects the flow rate of the gas 2 to be measured. The temperature and humidity sensor 206 detects the humidity of the gas 2 to be measured, and the intake air temperature sensor 203 detects the temperature of the gas to be measured.

The physical quantity detecting device 20 is arranged, for example, in an engine room of an automobile. The temperature in the engine room is 60° C. to 100° C., and the temperature of the gas 2 to be measured passing through the main passage 22 is 25° C. on average. Therefore, heat in the engine room is transferred to the physical quantity detecting device 20 from the flange 211 side, and a temperature distribution thereof is given such that the temperature gradually decreases as shifting from the flange 211 side toward the distal end portion side of the measurement unit 213.

Therefore, in the measurement unit 213 of the present embodiment, (1) the pressure sensor 204, which has the smallest thermal effect, is arranged on the proximal end side, and then, (2) the flow rate detection unit 205, which has a small thermal effect on the high temperature side, is arranged closer to the distal end portion side of the measurement unit 213 than (1) the pressure sensor 204. Then, (3) the temperature and humidity sensor 206, which has a small thermal effect on the low temperature side, is arranged to be closer to the distal end portion side of the measurement unit 213 than (2) the flow rate detection unit 205 next, and (4) the intake air temperature sensor 203, which is most susceptible to heat, is arranged at the distal end portion of the measurement unit 213.

According to the present embodiment, the center of the circuit board 207 in the longitudinal direction is cut out to form the accommodating portion 207a, and the proximal end portion 208a of the chip package 208 is accommodated therein. Then, the proximal end portion 208a of the chip package 208 is provided with the plurality of connection terminals 272 that protrude in the directions away from each other along the lateral direction of the package body 271. In the chip package 208, the distal end portion 271b including the flow rate detection unit 205 protrudes in a direction orthogonal to a passage direction of the sub-passage, and the plurality of connection terminals 272 are arranged to be divided into one side and the other side in the passage direction of the sub-passage.

In the circuit board 207, the plurality of pads 264 are provided to be divided into one side and the other side in the longitudinal direction of the circuit board 207, which is a portion to which the pads 264 opposes with the accommodating portion 207a therebetween, and the respective pads 264 are fixed by soldering. The chip package 208 has a stably supported structure in which both ends in the lateral direction of the proximal end portion 271a of the package body 271 are supported by the circuit board 207.

In addition, in the present embodiment, the chip package 208 is arranged such that the longitudinal direction of the package body 271 is orthogonal to the extending direction of the second sub-passage groove 252, and the plurality of connection terminals 272 divided into two sides at predetermined intervals in the extending direction of the second sub-passage groove 252 are joined to the pads 264 of the circuit board 207. Therefore, the chip package 208 can be attached at a correct position with respect to the circuit board 207 when being attached to the circuit board 207, and a structure is formed in which the second sub-passage groove 252 and the passage groove 273 of the package body 271 can be easily parallelized.

According to the present embodiment, the chip package 208 is arranged at an intermediate position between the pressure sensor 204 and the temperature and humidity sensor 206, and exchanges signals between these sensors. Therefore, it is possible to shorten a signal transmission path between the chip package 208 and each sensor, to improve the signal transmission speed, and to suppress generation of noise.

<Configuration of Chip Package 208>

Figure 7B:
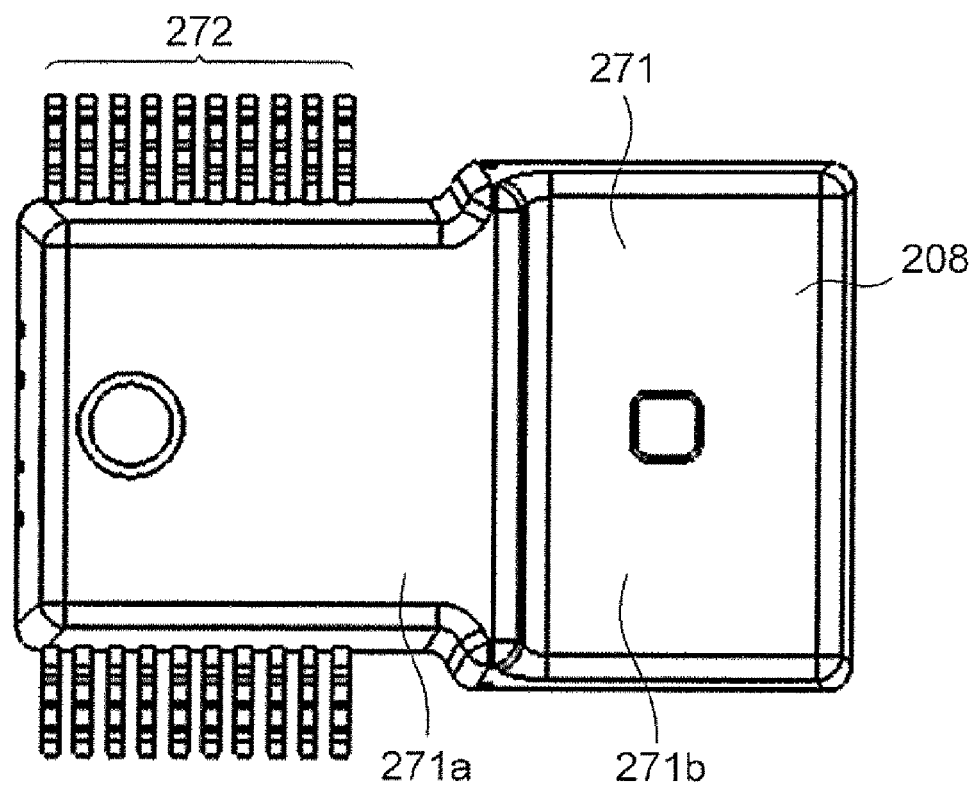
FIG. 7B is a back view of the chip package.
Figure 7C:
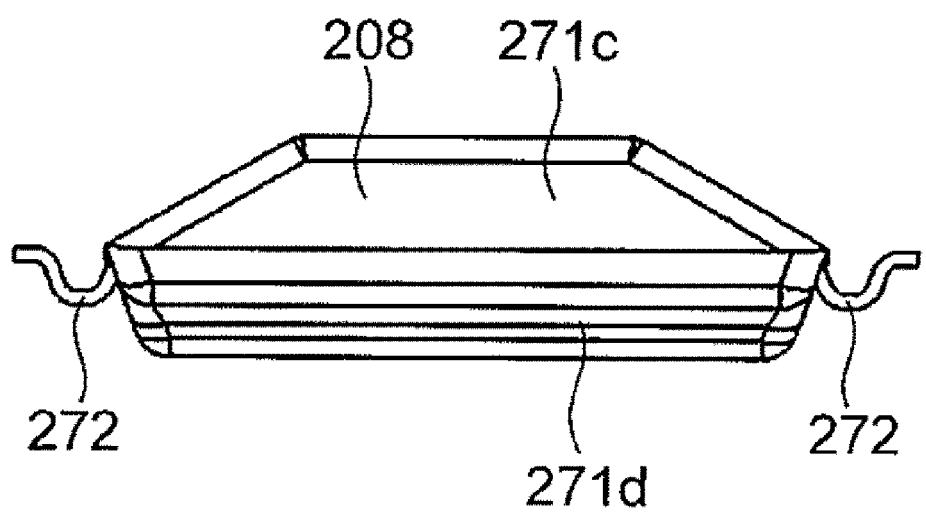
FIG. 7C is a side view of the chip package.
Figure 7D:
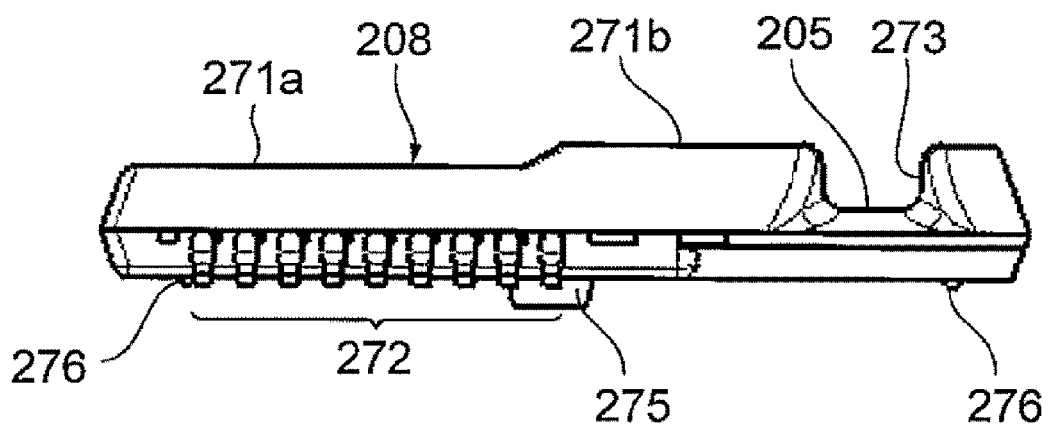
FIG. 7D is a bottom view of the chip package.
Figure 7E:
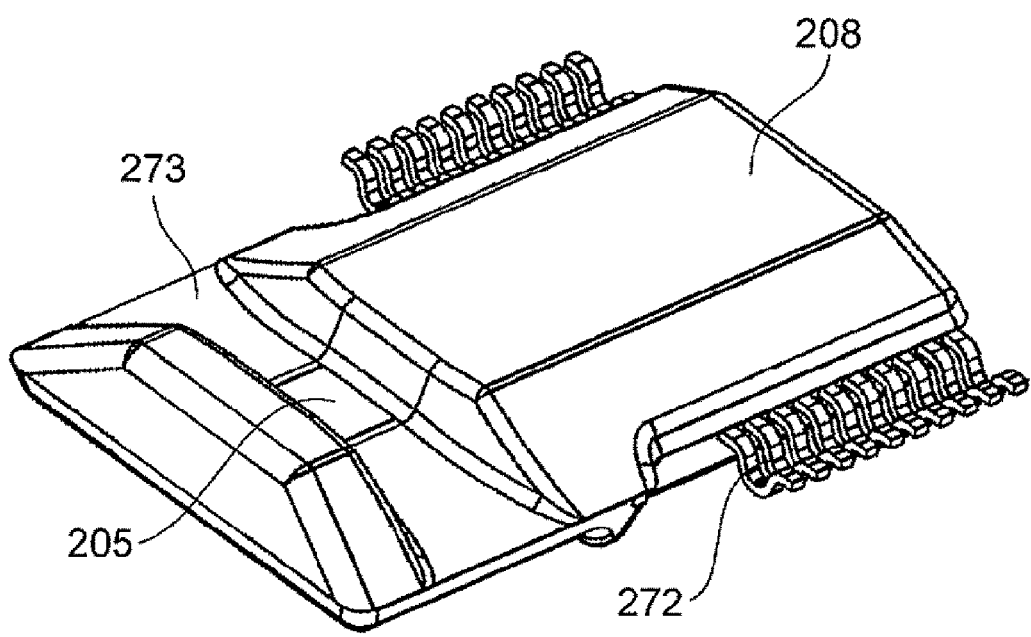
FIG. 7E is an isometric view of the chip package.

FIG. 7A is a front view of the chip package, FIG. 7B is a back view of the chip package, FIG. 7C is a side view of the chip package, FIG. 7D is a bottom view of the chip package, and FIG. 7E is an isometric view of the chip package.

The chip package 208 is configured by mounting the LSI and the flow rate detection unit 205 on a lead frame and sealing the resultant with thermosetting resin. The chip package 208 has the package body 271 that is resin-molded into a substantially flat plate shape. The package body 271 has a rectangular shape, and extends along the lateral direction of the measurement unit 213 such that the proximal end portion 271a on one side in the longitudinal direction of the package body 271 is arranged in the circuit chamber 235 and the distal end portion 271b on the other side in the longitudinal direction of the package body 271 is arranged in the second sub-passage groove 252.

The chip package 208 is electrically connected and physically fixed to the circuit board 207 by soldering the plurality of connection terminals 272 provided at the proximal end portion 271a of the package body 271 to the pads 264 of the circuit board 207. The flow rate detection unit 205 is provided at the distal end portion 271b of the package body 271. The flow rate detection unit 205 is arranged so as to be exposed in the second sub-passage B. The flow rate detection unit 205 is provided in the passage groove 273 provided to be recessed on the surface of the package body 271. The passage groove 273 is formed over the entire width from an end portion on one side in the lateral direction to an end portion on the other side in the lateral direction of the package body 271 so as to extend along the second sub-passage B in the second sub-passage B. The flow rate detection unit 205 has a diaphragm structure. When the chip package 208 is molded with resin, resin molding is performed by applying an insertion die such that the resin does not flow into the surface of the flow rate detection unit 205.

Figure 9:
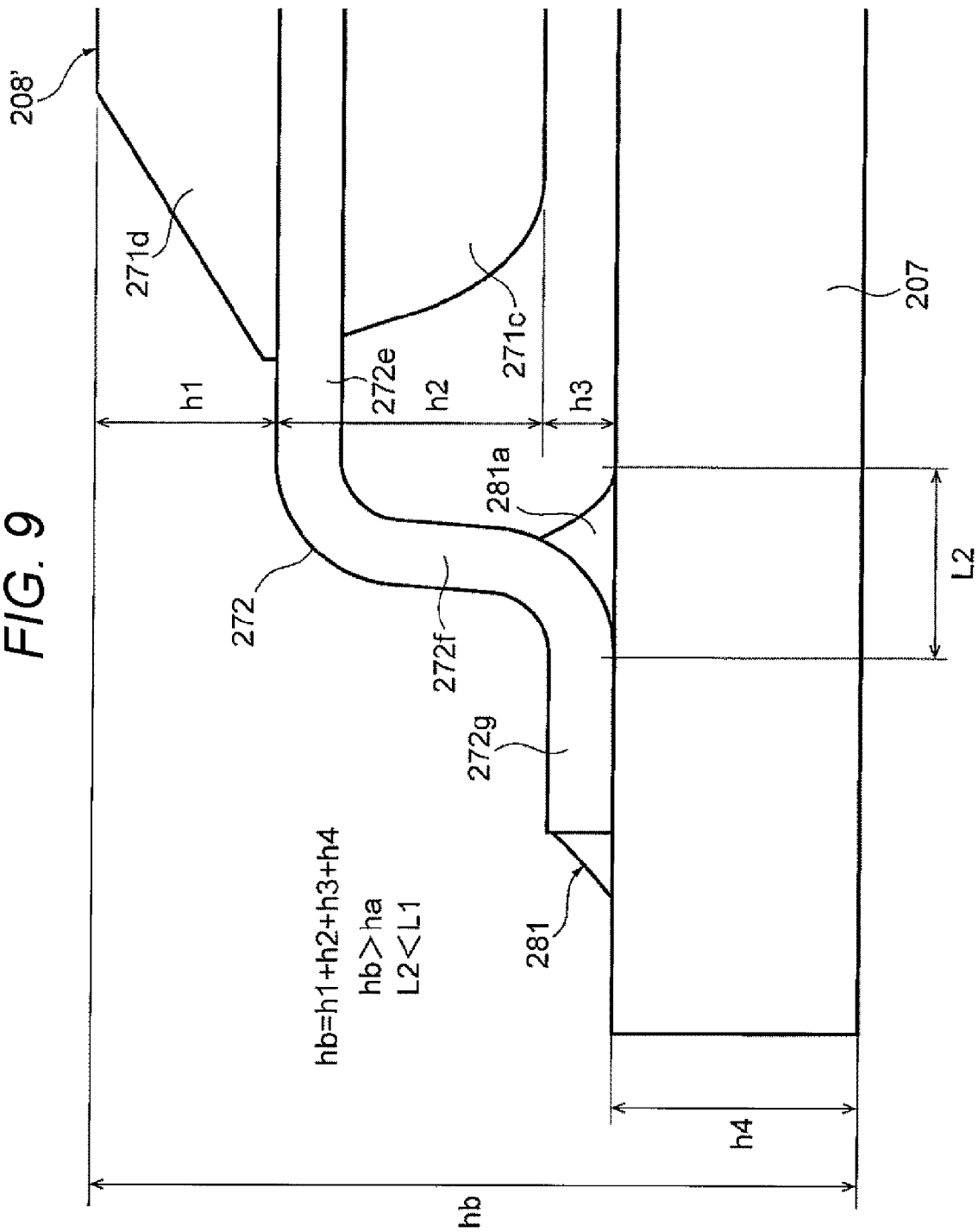
FIG. 9 is a view illustrating a bent shape of a connection terminal according to a comparative example.

FIG. 8 is a view illustrating a bent shape of the connection terminal according to the present embodiment, and FIG. 9 is a view illustrating a bent shape of a connection terminal according to a comparative example.

As illustrated in FIG. 8, the connection terminal 272 of the chip package 208 includes: a protruding portion 272a which is a proximal end portion, a rising portion 272b, a falling portion 272c, and an end portion 272d which is a distal end portion. The protruding portion 272a protrudes straight from the center of the package body 271 in the thickness direction along the lateral direction of the package body 271, and the rising portion 272b has a shape that rises from a distal end of the protruding portion 272a by being bent toward a package back surface portion 271d which is one side in the thickness direction of the package body 271. Then, the falling portion 272c has a shape that is continuous with the rising portion 272b and falls to be bent toward the package front surface portion 271c, which is the other side in the thickness direction of the package body 271 at a first bending height position, and the end portion 272d has a shape that is continuous with the falling portion 272c and protrudes in a direction away from the package body 271 at a second bending height position.

The protruding portion 272a and the end portion 272d are located at different positions of the package body 271 in the thickness direction, and the end portion 272d is formed so as to be higher by δ than the protruding portion 272a on the package back surface portion 271d side, which is one side in the thickness direction of the package body 271. Then, when the proximal end portion 271a of the package body 271 is accommodated in the accommodating portion 207a of the circuit board 207, the protruding portion 272a, which is the base of the connection terminal 272, is placed to abut on an upper surface of the circuit board 207 and the end portion 272d is arranged at a position facing the pad 264 on the upper surface of the circuit board 207 with the gap δ. That is, a state is formed in which the protruding portion 272a abuts on the top of the circuit board 207, and the end portion 272d floats from the circuit board 207.

The rising portion 272b and the falling portion 272c are formed to have gentle slopes such that a falling angle θa2 of the falling portion 272c is set to be larger than a rising angle θa1 of the rising portion 272b, the falling portion 272c is tilted more than the rising portion 272b with respect to the circuit board 207, and a slope of the falling portion 272c is gentler. In the present embodiment, a solder 281 is used as a joining member to join the end portion 272d and the pad 264 of the circuit board 207, and a so-called solder back fillet 281a in which the solder 281 protrudes in a direction returning from the end portion 272d to the protruding portion 272a along the axial direction of the connection terminal 272 is formed between the connection terminal 272 and the circuit board 207.

A chip package 208' of the comparative example illustrated in FIG. 9 is entirely arranged on the circuit board 207, and the connection terminals 272 thereof include a protruding portion 272e, a falling portion 272f, and an end portion 272g. The protruding portion 272e has a shape that protrudes from the center of the package body 271 in the thickness direction along the lateral direction of the package body 271, and the falling portion 272f has a shape that falls to be bent from a distal end of the protruding portion 272e to the package back surface portion 271d side. Then, the end portion 272g has a shape that is bent at a lower end of the falling portion 272f in a direction away from the package body 271 and protrudes along the lateral direction of the package body 271. The falling portion 272f is formed so as to have an angle substantially perpendicular to the upper surface of the circuit board 207.

When the chip package 208' of comparative example is mounted on the circuit board 207, a total thickness hb is a value obtained by adding all of a thickness h1 of the package back surface portion 271d of the package body 271, a thickness h2 of the package front surface portion 271c, a gap h3 with respect to the circuit board 207, and a thickness h4 of the circuit board 207 (hb=h1+h2+h3+h4). Since the chip package 208' of the comparative example is mounted on the circuit board 207, the overall mounting height becomes high. In addition, it is considered that the equivalent strain of the solder is largely affected by a change of a vertical strain in the Z direction, and a structure having a large mounting height is not desirable in terms of the life of the solder.

On the other hand, in the present embodiment, a total thickness ha when the chip package 208 of the present embodiment is mounted on the circuit board 207 is a value obtained by adding the thickness h2 of the package back surface portion 271d and the thickness h1 of the circuit board 207 (ha=h2+h1). Therefore, the present embodiment can achieve height reduction as compared with the comparative example. Incidentally, the thickness of the circuit board 207 can be made equal to the thickness h1 of the package back surface portion 271d of the package body 271 in the present embodiment.

According to the present embodiment, the falling portion 272c of the connection terminal 272 is gently tilted with respect to the circuit board 207, and thus, a length L1 of the solder back fillet 281a can be increased as compared with the falling portion 272f which is substantially perpendicular to the circuit board 207 of the comparative example (L2<L1). Therefore, the solder strain can be reduced and the life of the solder can be extended. In addition, the rising portion 272b of the connection terminal 272 has a smaller tilt angle than the falling portion 272c, and thus, the overall protrusion amount of the connection terminal 272 can be shortened, and the chip package 208 can be downsized.

Incidentally, the case where the solder is used as the joining member that joins the pad 264 of the circuit board 207 and the connection terminal 272 has been described in the above embodiment, the present invention is not limited thereto, and for example, a welding alloy or a conductive adhesive may be used.

As described above, the cover 202 attached to the housing 201 is configured using the conductive member, the circuit board 207 is fixed to the cover 202, and the chip package 208 is supported by the circuit board 207, in the physical quantity detecting device 20 of the present embodiment. The chip package 208 includes the flow rate detection unit 205, and is fixed to the circuit board 207 such that the flow rate detection unit 205 faces the cover 202. That is, the cover 202 is provided with a conductive potential, and the circuit board 207 or the chip package 208 for which static elimination is desirably performed is arranged on the cover 202. Therefore, it is unnecessary to provide an additional member for static elimination as compared with a configuration in which, for example, a member for which static elimination is desirably performed is stacked on a plate, a static elimination member is further placed on the member, and the plate and the static elimination member are electrically connected by an additional member (a conductive path for static elimination). Thus, the number of components can be reduced, and the assembly can be easily performed, so that cost reduction can be achieved by reducing the assembly man-hours. In addition, the member mounted on the cover 202 is the circuit board 207 in the present embodiment, and thus, there is also an effect that an electrical path can be relatively easily taken.

Further, a part of the package body 271 in the thickness direction is accommodated in the accommodating portion 207a of the circuit board 207 according to the present embodiment. Thus, as compared with the comparative example having the configuration in which the proximal end portion 271a of the package body 271 is mounted on the circuit board 207, the distance between the flow rate detection unit 205 and the cover 202 can be shortened, and the interval can be narrowed. Therefore, the gas 2 to be measured can be brought into contact with various places in the sub-passage 234 to promote the static elimination before the gas to be measured reaches and is supplied to the flow rate detection unit 205. In addition, it is possible to speed up the flow of the gas 2 to be measured passing through the passage groove 273 in which the flow rate detection unit 205 is provided, to increase the responsiveness of flow rate detection, and to reduce noise.

In the physical quantity detecting device 20 of the present embodiment, the chip package 208 includes the plurality of connection terminals 272, and is electrically connected and physically fixed by soldering the plurality of connection terminals 272 to the pads 264 of the circuit board 207. In the present embodiment, a part of the chip package 208 is accommodated in the accommodating portion 207a, and the protruding portion 272a, which is the base of the connection terminal 272, is placed on the circuit board 207, thereby positioning the chip package 208. In the comparative example, the end portion 272g provided at the folded distal end of the connection terminal 272 is placed on the pad of the circuit board 207 and soldered. Thus, positioning of the chip package 208 with respect to the circuit board 207 is difficult, and there is a problem that the terminal height varies greatly, which affects the position accuracy of the flow rate detection unit 205. According to the present embodiment, it is easier to position the chip package 208 with respect to the circuit board 207 as compared with the comparative example, and there is an advantage that the accuracy of the position where the flow rate detection unit 205 is arranged is high.

Figure 10A:
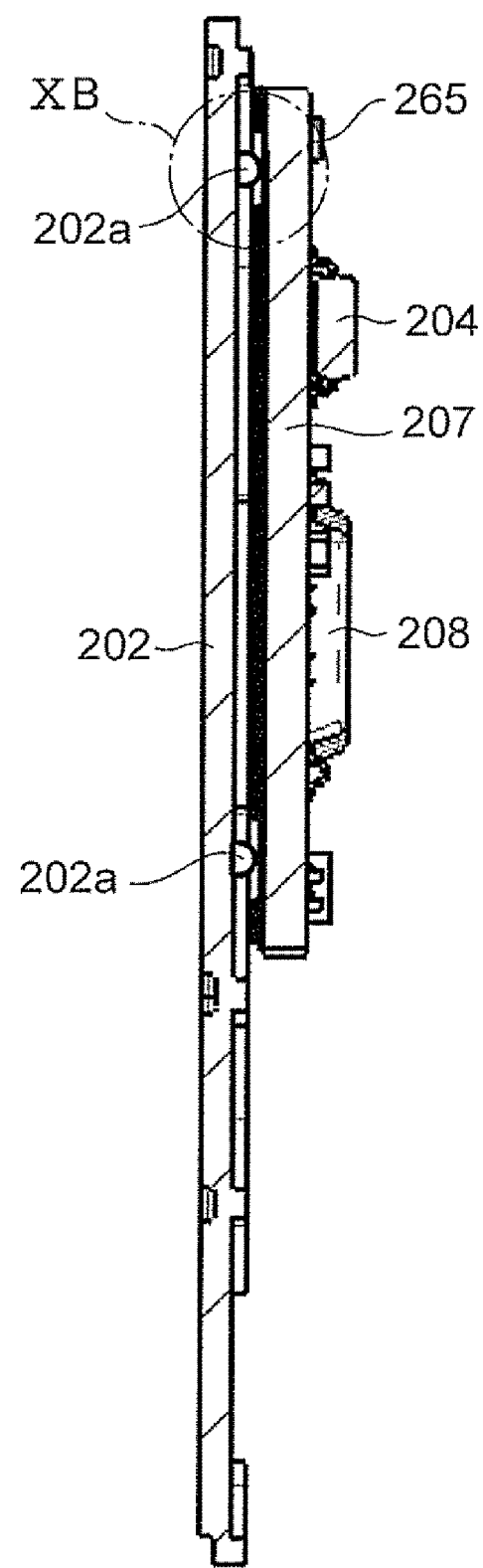
FIG. 10A is a cross-sectional view taken along the line XA-XA of FIG. 5.
Figure 10B:
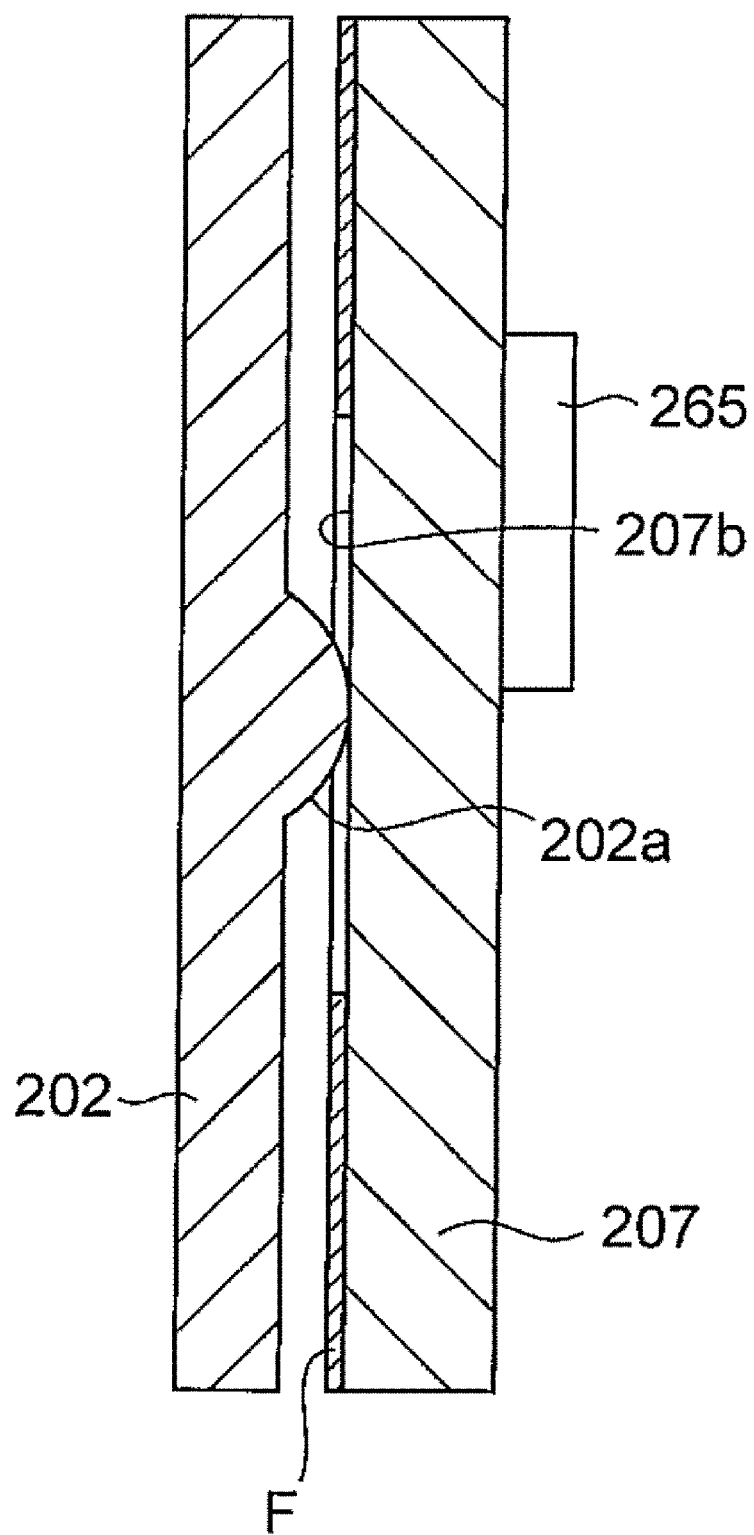
FIG. 10B is an enlarged view of XB in FIG. 10A.
Figure 11:
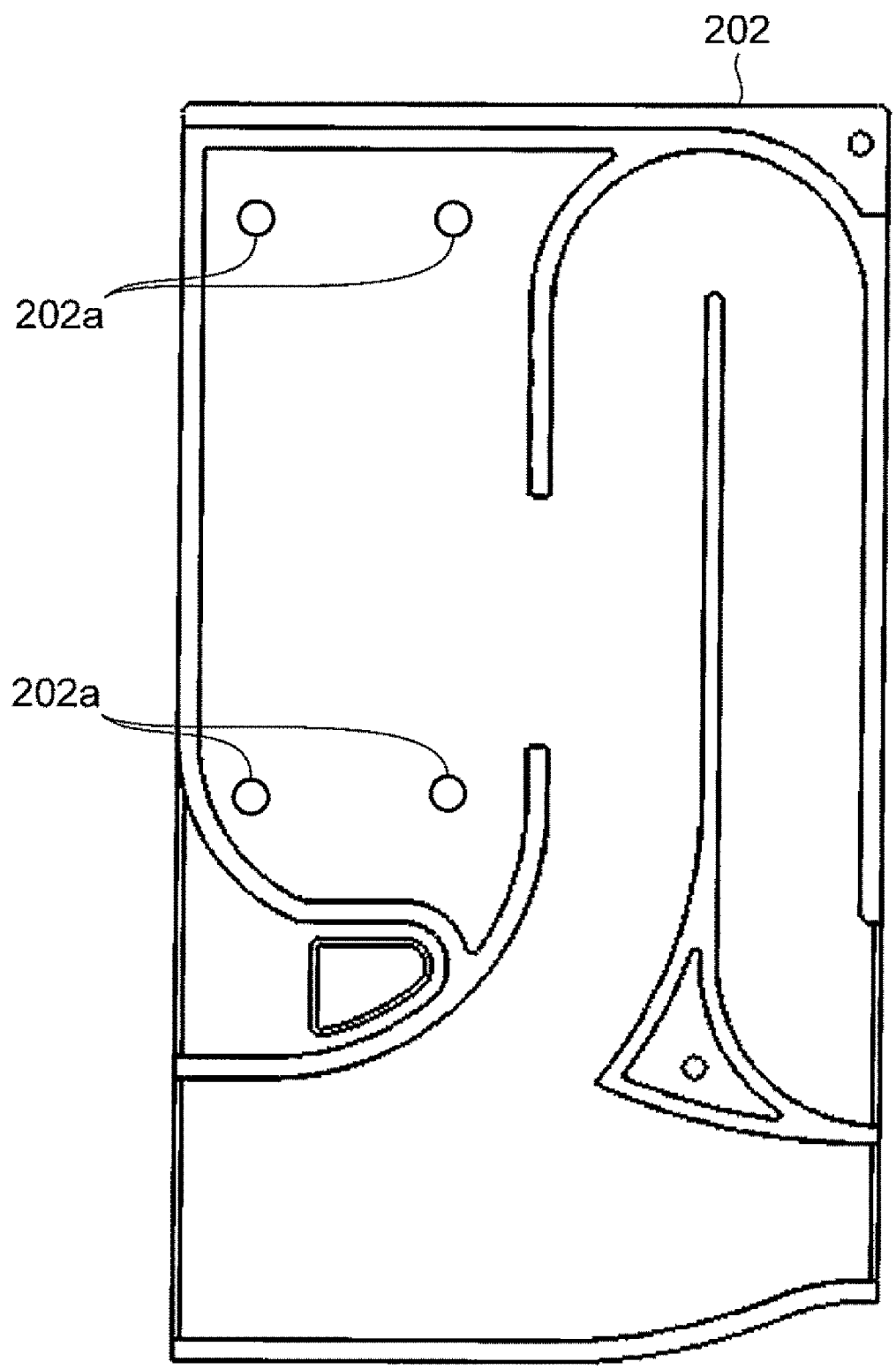
FIG. 11 is a view illustrating a back surface of the cover.

FIGS. 10A to 10C are views illustrating an embodiment of a support structure of a circuit board configured to fix a potential of a cover, FIG. 10A is a cross-sectional view taken along the line XA-XA of FIG. 5, FIG. 10B is an enlarged view of XB of FIG. 10A, and FIG. 11 is a view illustrating the back surface of the cover.

The cover assembly is assembled by attaching the circuit board 207 on which the chip package 208 is mounted to the back surface of the cover 202. The circuit board 207 is fixed to the cover 202 with an adhesive. A plurality of protrusions 202a configured to support the circuit board 207 are provided in a region of the cover 202 to which the circuit board 207 is attached. The number of protrusions 202a is preferably three or more, and is four in the present embodiment as illustrated in FIG. 11.

The plurality of protrusions 202a have a convex spherical shape so as to be capable of making point-contact with a resist opening 207b of the circuit board 207. The shape of the protrusion 202a is not limited to the convex spherical shape, and any shape that can make point-contact, line-contact, or surface-contact with the resist opening 207b of the circuit board 207 may be used, and may have a conical shape or a convex shape having a triangular or quadrangular cross section, for example.

The entire surface of the circuit board 207 is coated and covered with a resist F, but the resist F is not applied to a portion facing the protrusion 202a, and the resist opening 207b that exposes the conductor of the circuit board 207 is provided as illustrated in FIG. 10B. The circuit board 207 is fixed in a state where the protrusion 202a comes into contact with the resist opening 207b of the circuit board 207, and the cover 202 and the circuit board 207 are electrically connected and fixed to a constant potential. According to the present embodiment, the circuit board 207 and the cover 202 can be electrically connected to each other without adding a special component, and the potential of the cover 202 can be fixed.

The circuit board 207 is accurately positioned with respect to the cover 202 by being supported by the plurality of protrusions 202a. When the circuit board 207 is fixed to the cover 202 with an adhesive, variations in mounting height of the circuit board 207 can be reduced. In addition, the tilt of the circuit board 207 with respect to the cover 202 can be suppressed by being supported by the three or more protrusions 202a. Since the flow rate detection unit 205 is mounted on the circuit board 207, there is a possibility that the characteristics of flow rate detection may be affected by the tilt of the circuit board 207. According to the present embodiment, relative positions of the flow rate detection unit 205 of the chip package 208 mounted on the circuit board 207 and the cover 202 facing the flow rate detection unit 205 are accurately positioned by the three or more protrusions 202a, and the flow rate detection unit 205 can detect the flow rate with high accuracy.

The plurality of protrusions 202a are preferably provided at positions capable of stably supporting the circuit board 207, and it is particularly preferable that at least one protrusion be provided in the vicinity of a bonding position as illustrated in FIGS. 10A and 10B. For example, as illustrated in FIG. 3B, when the connector terminal 214 and the pad 265 of the circuit board 207 are electrically connected by the bonding wire 266, the bonding wire 266 is pressed against the pad 265 of the circuit board 207 by a bonding device (not illustrated). When the protrusion 202a is arranged in the vicinity of the pad 265, a pressing force can be received by the protrusion 202a, and the processing accuracy of the bonding process can be increased.

The resist opening 207b is different from a through-hole 207c to be described later, and can be provided at a relatively free position on the back surface of the circuit board 207 regardless of presence of a mounting component on the surface of circuit board 207 corresponding to the position of the resist opening 207b. Therefore, the degree of freedom in designing the position where the protrusion 202a is provided is high, and the implementation can be easily performed. Therefore, for example, the resist opening 207b can be provided immediately below the pad 265, and the pressing force during the bonding process can be directly received by the protrusion 202a, and the processing accuracy of the bonding process can be improved.

Figure 12A:
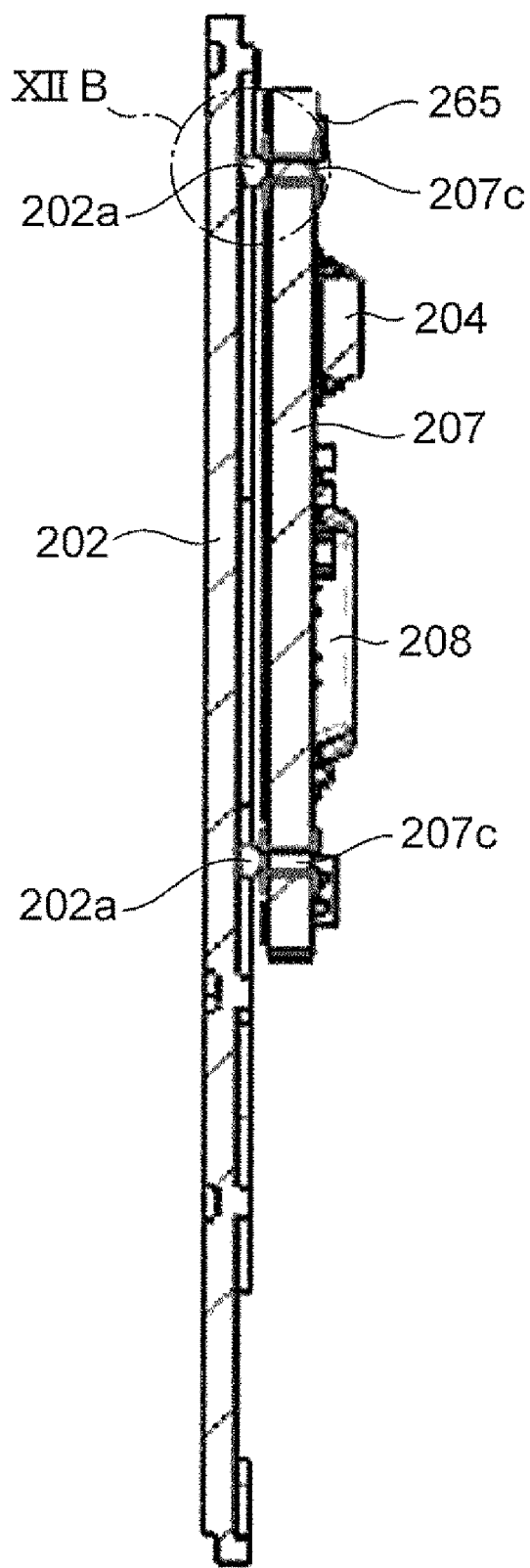
FIG. 12A is a view illustrating another embodiment of a support structure of the circuit board, and is the view corresponding to FIG. 10A.
Figure 12B:
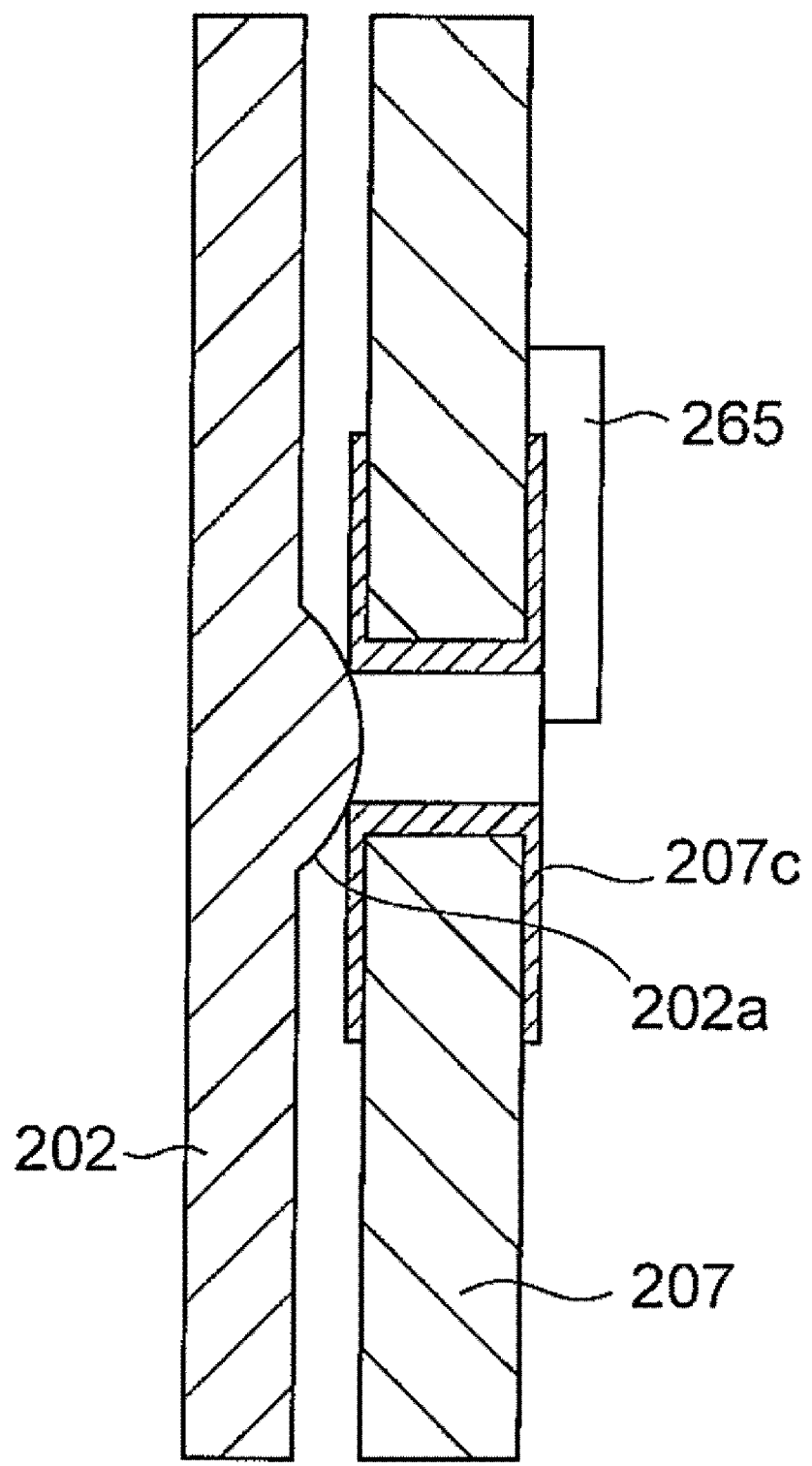
FIG. 12B is an enlarged view of XIIB in FIG. 12A.

FIGS. 12A and 12B are views illustrating another embodiment of the support structure of the circuit board, FIG. 12A is a view corresponding to FIG. 10A, and FIG. 12B is an enlarged view of XIIB of FIG. 12A.

A characteristic of the present embodiment is a configuration in which the protrusion 202a is fitted in the through-hole 207c of the circuit board 207. The circuit board 207 is provided with the through-hole 207c that penetrates the circuit board 207 in the thickness direction and electrically connects the front surface and the back surface of the circuit board 207. The through-hole 207c is provided at four places in the present embodiment.

The through-hole 207c has an opening on the back surface of the circuit board 207, which is large enough to allow a part of the protrusion 202a to enter. The protrusion 202a is provided at a position facing the through-hole 207c when the circuit board 207 is attached to the cover 202. The circuit board 207 is fixed in a state where the protrusion 202a is fitted in the through-hole 207c of the circuit board 207, and the cover 202 and the circuit board 207 are electrically connected and fixed to a constant potential.

The circuit board 207 is accurately positioned with respect to the cover 202 by fitting the protrusion 202a of the cover 202 into the through-hole 207c. Therefore, relative positions of the flow rate detection unit 205 of the chip package 208 mounted on the circuit board 207 and the cover 202 facing the flow rate detection unit 205 are accurately positioned, and the flow rate detection unit 205 can detect the flow rate with high accuracy.

A position of the through-hole 207c is preferably provided at a position capable of stably supporting the circuit board 207, and at least one through-hole is preferably provided in the vicinity of the bonding position. When the protrusion 202a is arranged in the vicinity of the pad 265, a pressing force can be received by the protrusion 202a, and the processing accuracy of the bonding process can be increased.

Figure 13A:
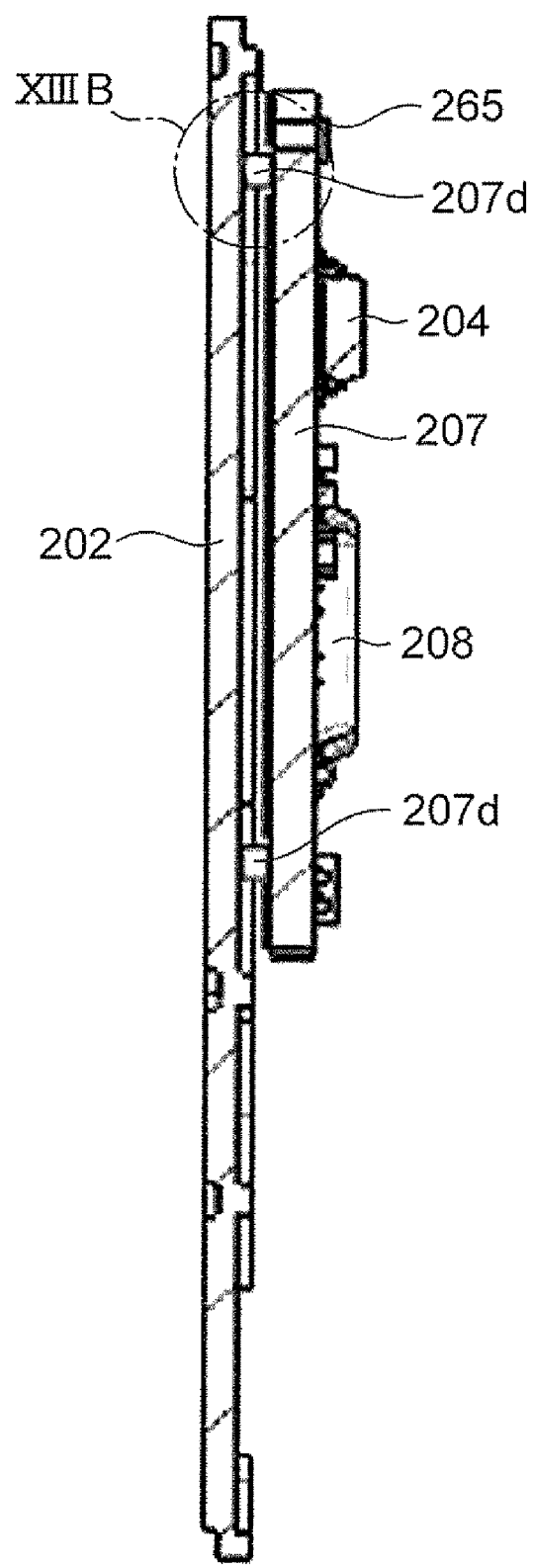
FIG. 13A is a view illustrating still another embodiment of the support structure of the circuit board, and is the view corresponding to FIG. 10A.
Figure 13B:
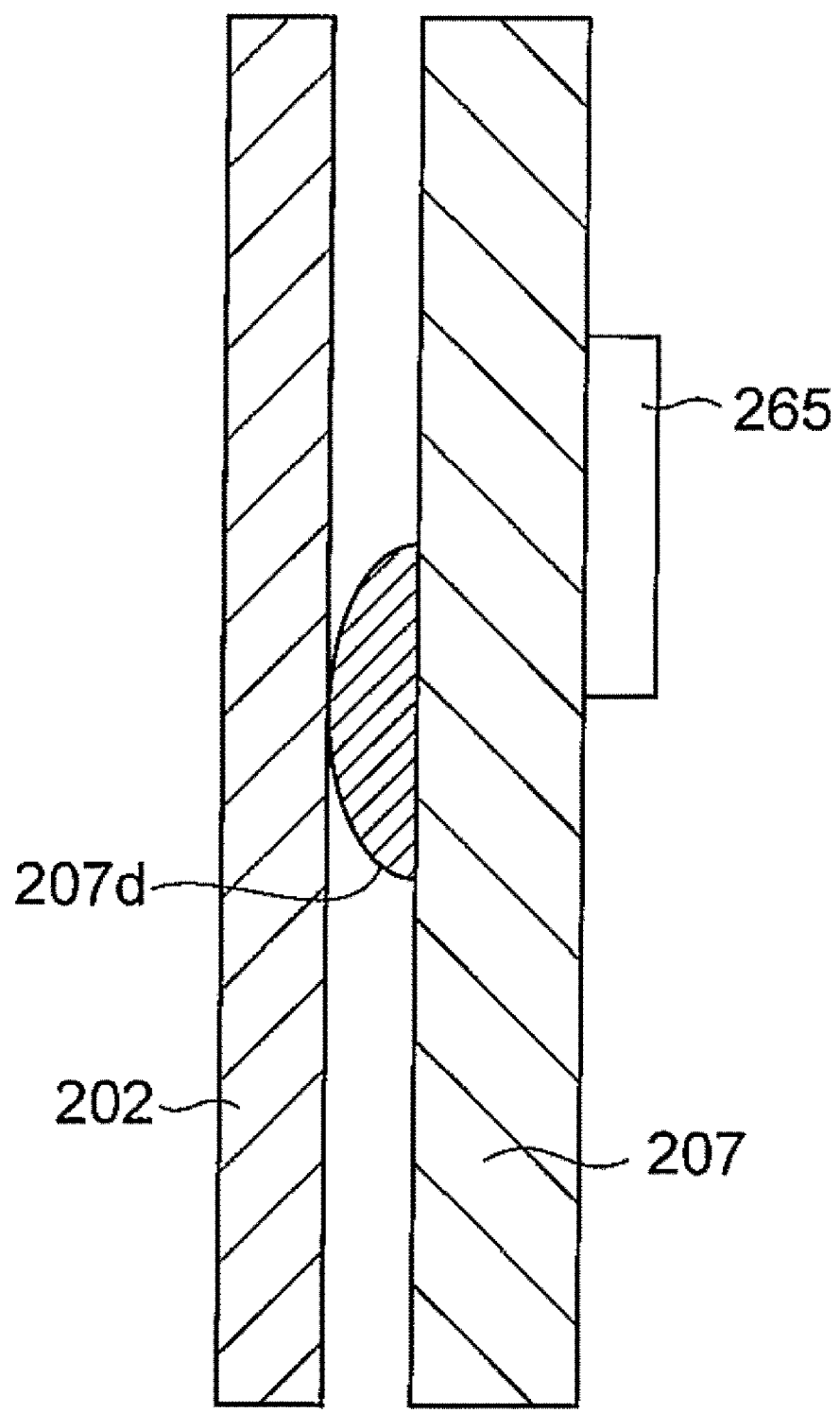
FIG. 13B is an enlarged view of XIIIB in FIG. 13A.

FIGS. 13A and 13B are views illustrating still another embodiment of the support structure of the circuit board, FIG. 13A is a view corresponding to FIG. 10A, and FIG. 13B is an enlarged view of XIIIB of FIG. 13A.

A characteristic of the present embodiment is a configuration in which the circuit board 207 is provided with a conductive convex portion 207d, and the convex portion 207d is brought into contact with the cover 202. A plurality of the convex portions 207d are provided on the back surface of the circuit board 207. The convex portion 207d is formed using a so-called solder land in which a solder is formed into an island shape having a predetermined height. Incidentally, the solder is used for the convex portion 207d in the present embodiment, but any conductive member may be used, for example, a connection terminal such as a pad may be used. The convex portions 207d are provided at positions capable of stably supporting the circuit board 207 with respect to the cover 202, and are provided at four positions so as to be located at corners of the circuit board 207 in the present embodiment.

The circuit board 207 is fixed to the cover 202 in a state where the convex portion 207d of the circuit board 207 is in contact with the back surface of the cover 202, and the cover 202 and the circuit board 207 are electrically connected and fixed to a constant potential.

The circuit board 207 is accurately positioned with respect to the cover 202 as the convex portions 207d of the circuit board 207 are brought into contact with the back surface of the cover 202. Therefore, relative positions of the flow rate detection unit 205 of the chip package 208 mounted on the circuit board 207 and the cover 202 facing the flow rate detection unit 205 are accurately positioned, and the flow rate detection unit 205 can detect the flow rate with high accuracy.

A position of the convex portion 207d is preferably provided at the position capable of stably supporting the circuit board 207 with respect to the cover 202, and at least one convex portion is preferably provided in the vicinity of the bonding position. When the convex portion 207d is provided in the vicinity of the pad 265, a pressing force can be transmitted to the cover 202 via the convex portion 207d and received by the cover 202, so that the processing accuracy of the bonding process can be improved.

Figure 14:
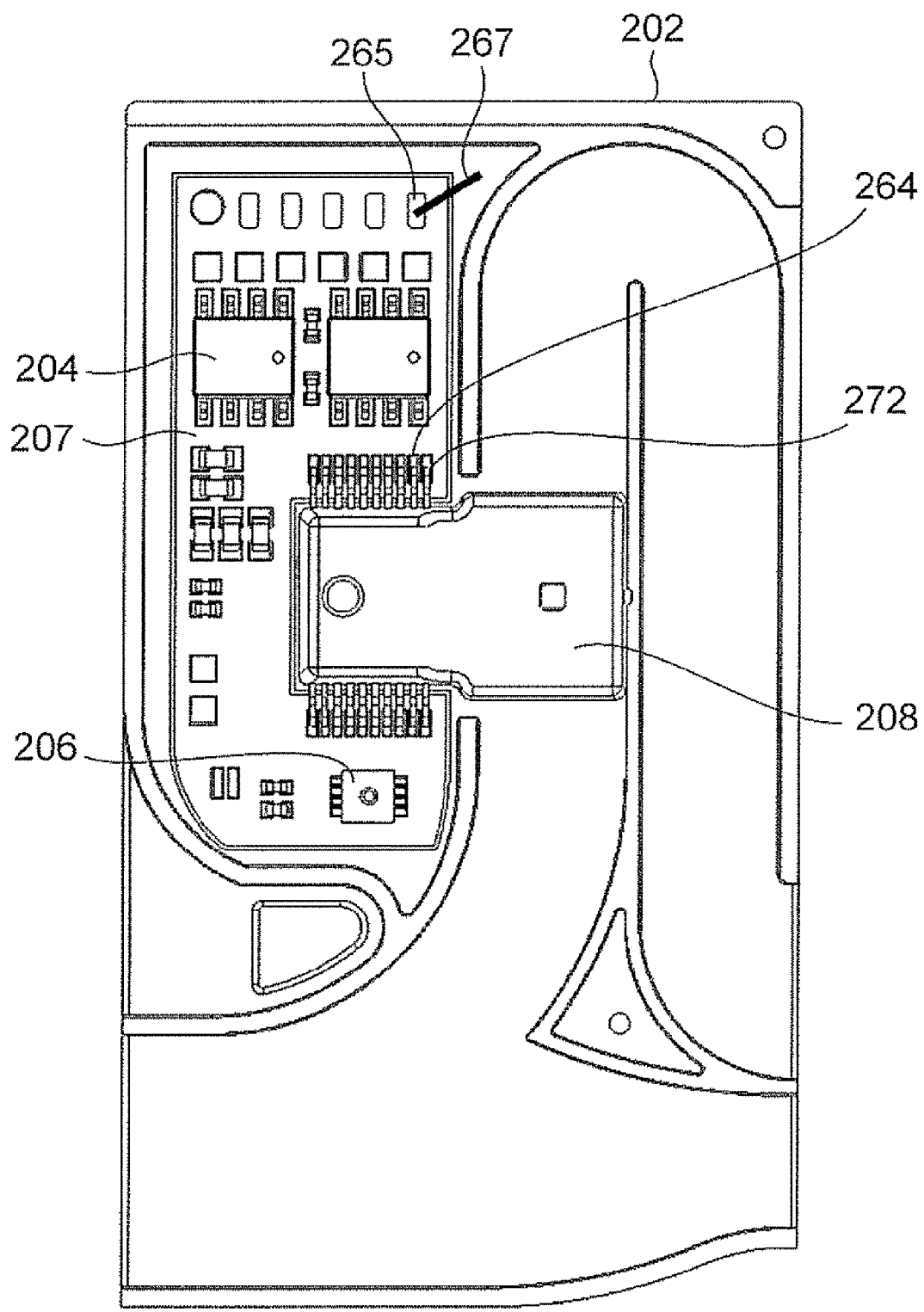
FIG. 14 is a view for describing another embodiment of the circuit board, and is the view corresponding to FIG. 5.

FIG. 14 is a view for describing another embodiment of the circuit board, and is the view corresponding to FIG. 5.

A characteristic of the present embodiment is a configuration in which the circuit board 207 and the cover 202 are electrically connected by a bonding wire 267.

The bonding wire 267 has one end bonded to the pad 265 of the circuit board 207 and the other end bonded to the back surface of the cover 202. Bonding work can be performed simultaneously, for example, when bonding the plurality of pads 265 of the circuit board 207 and the connector terminals 214 of the housing 201 with bonding wires. According to the present embodiment, a potential of the cover 202 can be fixed regardless of a method of attaching the circuit board 207 to the cover 202. The present embodiment may be carried out in addition to the above-described respective embodiments, or may be carried out independently without accompanying the above-described respective embodiments.

According to the present embodiment, the cover 202 and the pad 265 of the circuit board 207 are electrically connected by the bonding wire 267, and the cover 202 is fixed at a constant potential. Since the present embodiment uses a junction rather than the contact as in the above-described respective embodiments, the cover 202 can be electrically connected to the circuit board 207 in a reliable manner, and the cover 202 can be reliably fixed at the constant potential.

Figure 15:
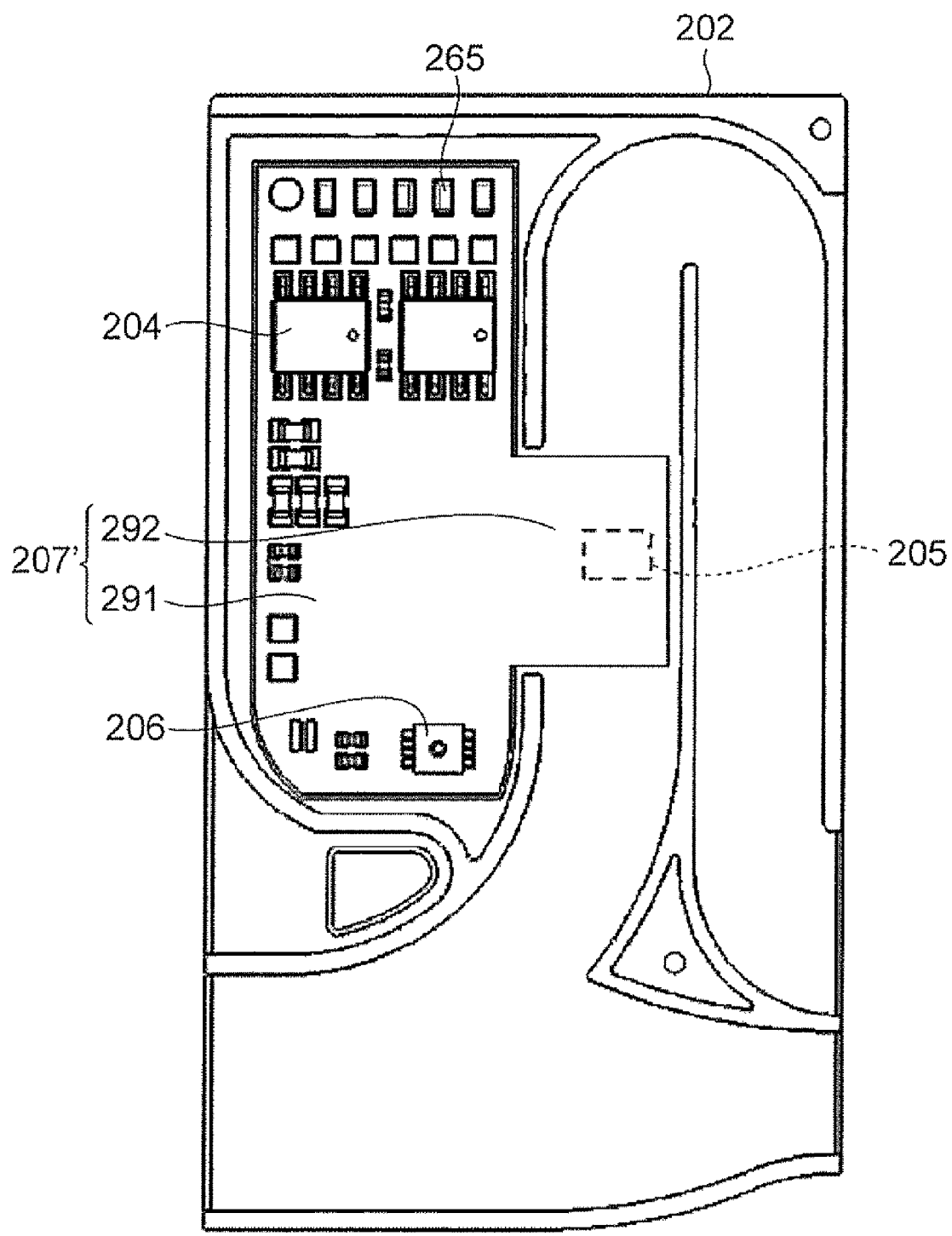
FIG. 15 is a view for describing still another embodiment of the circuit board, and is the view corresponding to FIG. 5.

FIG. 15 is a view for describing still another embodiment of the circuit board, and is the view corresponding to FIG. 5.

A characteristic of the present embodiment is that the flow rate detection unit 205 is directly mounted on a circuit board 207'. Although the case where the chip package 208 having the flow rate detection unit 205 is mounted on the circuit board 207 has been described as an example in the above-described respective embodiments, the chip package 208 is not an essential element and it suffices that the flow rate detection unit 205 is fixed to the circuit board 207' so as to face the cover 202.

The circuit board 207' has a substantially T shape that extends in a longitudinal direction and protrudes in a lateral direction from a central position in the longitudinal direction. In the circuit board 207', a body portion 291 extending in the longitudinal direction is accommodated in the circuit chamber 235 of the housing 201, and a protruding portion 292 protruding from the body portion 291 is arranged in the second sub-passage B.

The flow rate detection unit 205 is provided on the protruding portion 292 of the circuit board 207' on a back surface of the circuit board 207', and is arranged to oppose the cover 202 with a predetermined interval so as to allow passage of the gas 2 to be measured that has flowed into the second sub-passage B.

According to the present embodiment, since the flow rate detection unit 205 is directly provided on the circuit board 207', relative positions of the flow rate detection unit 205 and the cover 202 facing the flow rate detection unit 205 are accurately positioned, and the flow rate detection unit 205 can detect the flow rate with high accuracy.

Figure 16:
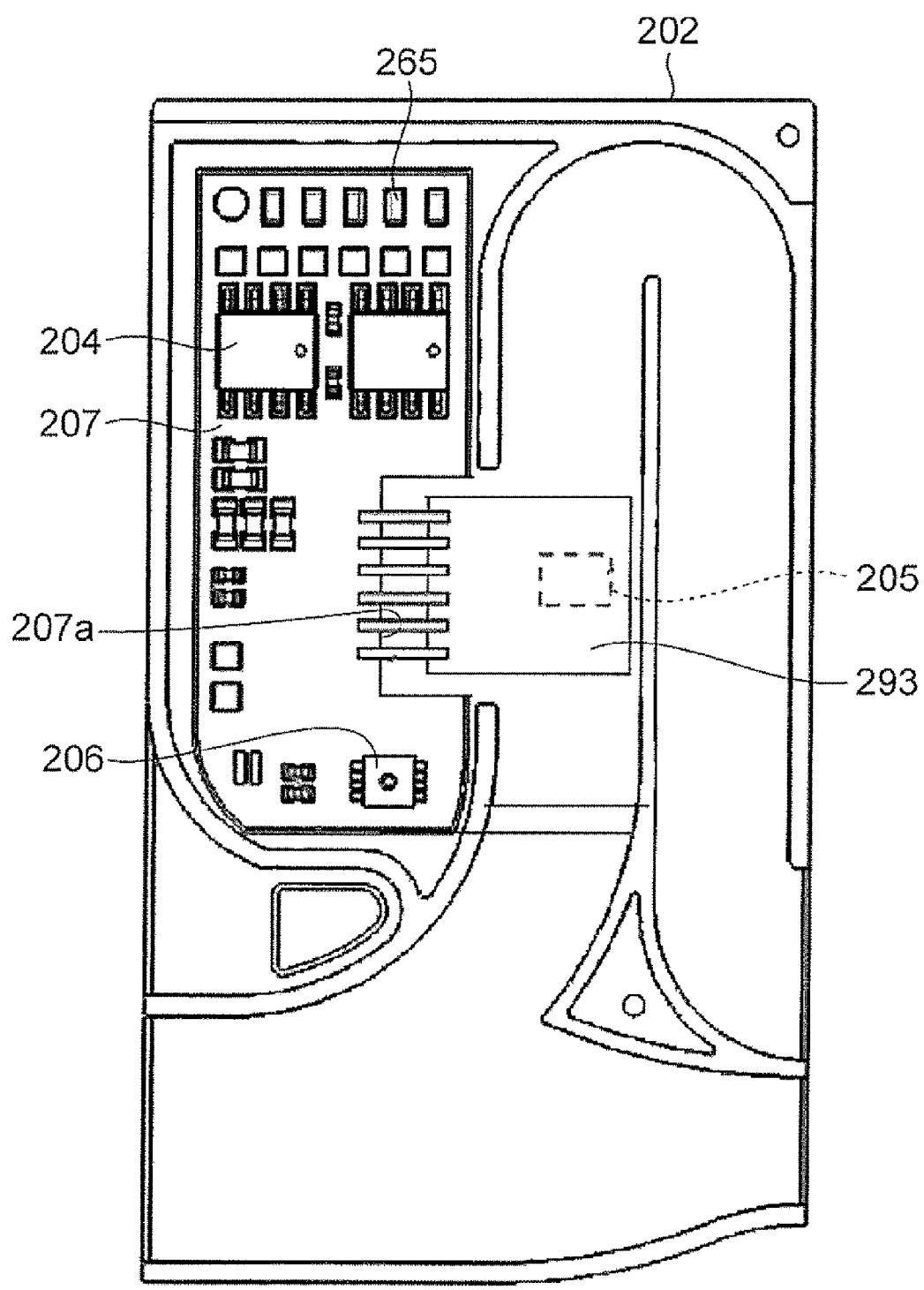
FIG. 16 is a view for describing another embodiment of the cover assembly, and is the view corresponding to FIG. 5.

FIG. 16 is a view for describing another embodiment of the cover assembly, and is the view corresponding to FIG. 5.

A characteristic of the present embodiment is that a mounting board 293 on which the flow rate detection unit 205 is mounted is used, instead of the chip package 208. Although the case where the chip package 208 having the flow rate detection unit 205 is mounted on the circuit board 207 has been described as an example in the above-described respective embodiments, the chip package 208 is not an essential element and it suffices that the flow rate detection unit 205 is fixed to the circuit board 207 so as to face the cover 202.

The mounting board 293 has a proximal end portion accommodated in the accommodating portion 207a of the circuit board 207, and a distal end portion protruding to be arranged in the second sub-passage B. The flow rate detection unit 205 is provided on a back surface of the mounting board 293, and is arranged to oppose the cover 202 with a predetermined interval so as to allow passage of the gas 2 to be measured that has flowed into the second sub-passage B. According to the present embodiment, the yield is higher than that of the above-described substantially T-shaped circuit board 207', and thus, the number of the circuit boards 207 can be increased.

According to the present embodiment, the stress acting on a measuring element of the flow rate detection unit 205 is reduced as compared with a case where components such as the flow rate detection unit 205 are directly mounted on the circuit board 207, so that the durability and reliability of the physical quantity detecting device 20 can be improved. Incidentally, to mount the components on the circuit board 207 includes, for example, to attach the components to the circuit board 207, and to electrically connect the components to a wiring of the circuit board 207. Examples of the mounting board 293 include a metal lead frame, an LTCC board, a printed board on which an electrical wiring can be formed, and a metal plate.

As above, the embodiments of the present invention have been described in detail, but the present invention is not limited to the above-described embodiments, and various design modifications can be made without departing from the spirit of the present invention recited in the claims. For example, the above-described embodiments have been described in detail in order to describe the present invention in an easily understandable manner, and are not necessarily limited to one including the entire configuration that has been described above. In addition, configurations of another embodiment can be substituted for some configurations of a certain embodiment, and further, a configuration of another embodiment can be added to a configuration of a certain embodiment. Further, addition, deletion, or substitution of other configurations can be made with respect to some configurations of each embodiment.

REFERENCE SIGNS LIST 1 internal combustion engine control system
2 measurement gas
20 physical quantity detecting device
22 main passage
201 housing
202 cover
203 intake air temperature sensor
204 pressure sensor
205 flow rate detection unit
206 temperature and humidity sensor
207 circuit board
208 chip package
211 flange
212 connector
213 measurement unit
214 connector terminal
221 front surface
222 back surface
223 side surface on one side
224 side surface on other side
226 lower surface
231 sub-passage inlet
232 first outlet
233 second outlet
234 sub-passage
235 circuit chamber
237 rib (bottom surface of circuit chamber)
240 ventilation passage
241 fixing hole
242 through-hole
243 first rib
244 second rib
245 third rib
246 fourth rib
247 external terminal
248 correction terminal
249 ventilation hole (ventilation passage outlet)
250 sub-passage groove
251 first sub-passage groove
252 second sub-passage groove
253 protrusion
254 ventilation hole (ventilation passage inlet)
255 R3 inlet
256 ventilation groove
263 pad (for intake air temperature sensor)
264 pad (for chip package terminal)
265 pad (for wire bonding)
271 package body
272 connection terminal
273 passage groove

The invention claimed is:

1. A physical quantity detecting device comprising:
a semiconductor element having a flow rate detection unit;
a circuit board supporting the semiconductor element; and
a conductive base member fixing the circuit board,
wherein the semiconductor element is fixed to the circuit board such that the flow rate detection unit faces the base member, and the base member is electrically connected to the circuit board and fixed at a constant potential.

2. The physical quantity detecting device according to claim 1, wherein
the circuit board is provided with a resist opening in which a conductor is exposed, and a protrusion provided on the base member is in contact with the conductor exposed from the resist opening.

3. The physical quantity detecting device according to claim 1, wherein the circuit board is provided with a through-hole penetrating the circuit board, and a protrusion provided on the base member and the through-hole are fitted to each other.

4. The physical quantity detecting device according to claim 1, wherein the circuit board is provided with a solder land, and the solder land and the base member come into contact with each other.

5. The physical quantity detecting device according to claim 1, wherein the circuit board is a glass epoxy board.

6. The physical quantity detecting device according to claim 1, wherein the base member is made of an aluminum alloy.

7. The physical quantity detecting device according to claim 1, further comprising a sub-passage to supply a gas to be measured to the flow rate detection unit, wherein the base member forms a part of the sub-passage.

8. The physical quantity detecting device according to claim 7, further comprising a support body that supports the semiconductor element, wherein, in the support body, a part in a thickness direction of a proximal end portion of the support body is accommodated in an accommodating portion of the circuit board such that the proximal end portion of the support is supported by the circuit board, and a distal end portion of the support body including the flow rate detection unit protrudes from the circuit board and is arranged in the sub-passage.

* * * * *